United States Patent
Han et al.

(10) Patent No.: US 12,520,613 B2
(45) Date of Patent: Jan. 6, 2026

(54) IMAGE SENSOR AND METHOD OF FABRICATING THE SAME

(71) Applicant: SAMSUNG ELECTRONICS CO., LTD., Suwon-si (KR)

(72) Inventors: Dongmin Han, Suwon-si (KR); Seungjoo Nah, Gwangju (KR); Heegeun Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 940 days.

(21) Appl. No.: 17/693,069

(22) Filed: Mar. 11, 2022

(65) Prior Publication Data
US 2023/0005971 A1 Jan. 5, 2023

(30) Foreign Application Priority Data
Jun. 30, 2021 (KR) ........................ 10-2021-0086082

(51) Int. Cl.
*H10F 39/00* (2025.01)

(52) U.S. Cl.
CPC .......... *H10F 39/807* (2025.01); *H10F 39/802* (2025.01); *H10F 39/80373* (2025.01); *H10F 39/8053* (2025.01); *H10F 39/8063* (2025.01); *H10F 39/809* (2025.01); *H10F 39/811* (2025.01)

(58) Field of Classification Search
CPC .............. H10F 39/807; H10F 39/8063; H10F 39/8053; H10F 39/802; H10F 39/809; H10F 39/811; H10F 39/80373
See application file for complete search history.

(56) References Cited

U.S. PATENT DOCUMENTS

| | | | |
|---|---|---|---|
| 9,312,298 B2 | 4/2016 | Yamashita | |
| 9,318,521 B2 | 4/2016 | Ihara | |
| 10,573,676 B2 | 2/2020 | Yun et al. | |
| 10,586,821 B2 | 3/2020 | Miyanami | |
| 10,861,887 B2 | 12/2020 | Lee et al. | |
| 11,393,854 B2 | 7/2022 | Kim et al. | |
| 2014/0197464 A1 | 7/2014 | Ihara | |
| 2014/0246707 A1* | 9/2014 | Koo | H10F 39/80373 257/230 |
| 2016/0284746 A1 | 9/2016 | Fukase et al. | |

(Continued)

FOREIGN PATENT DOCUMENTS

| | | |
|---|---|---|
| KR | 10-2014-0108940 A | 9/2014 |
| KR | 10-2018-0113726 A | 10/2018 |

(Continued)

*Primary Examiner* — Trang Q Tran
(74) *Attorney, Agent, or Firm* — Fish & Richardson P.C.

(57) ABSTRACT

An image sensor includes; a semiconductor substrate including a first surface and an opposing second surface, a pixel isolation structure in the semiconductor substrate and defining a pixel section, a photoelectric conversion region in the pixel section, a first device isolation layer on the pixel section and defining an active area on the first surface of the semiconductor substrate, a floating diffusion region in the active area and spaced apart from the photoelectric conversion region, a transfer gate electrode on the active area between the photoelectric conversion region and the floating diffusion region, and a second device isolation layer in the active area between the transfer gate electrode and the floating diffusion region.

20 Claims, 16 Drawing Sheets

(56) References Cited

U.S. PATENT DOCUMENTS

| | | | |
|---|---|---|---|
| 2018/0061873 A1* | 3/2018 | Lee | H10F 39/8053 |
| 2018/0145104 A1* | 5/2018 | Kim | H10F 39/805 |
| 2019/0252428 A1 | 8/2019 | Ma et al. | |
| 2021/0005647 A1 | 1/2021 | Kwag et al. | |

FOREIGN PATENT DOCUMENTS

| | | |
|---|---|---|
| KR | 10-2087233 B1 | 3/2020 |
| KR | 10-2020-0085983 A | 7/2020 |

* cited by examiner

IMAGE SENSOR AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0086082 filed on Jun. 30, 2021 in the Korean Intellectual Property Office, the subject matter of which is hereby incorporated by reference in its entirety.

BACKGROUND

The inventive concept relates generally to image sensors and methods of fabricating same.

An image sensor converts photonic images into electrical signals. Many contemporary and emerging consumer electronic products (e.g., digital cameras, camcorders, personal communication systems, game consoles, security cameras, medical devices, micro-cameras, etc.) include one or more image sensors.

Image sensors may be broadly classified as charged coupled devices (CCD) or Complementary Metal Oxide Semiconductor (CMOS) devices. The CMOS image sensor has a simple operating method, and the size of incorporating components, system or products may be minimized because the signal processing circuitry associated with the CMOS image sensor may be integrated into a single semiconductor chip. The CMOS image sensor also provide relatively low power consumption, as compared with CCD image sensors, a useful attribute when the CMOS image sensor is incorporated in a battery-powered product. Further, since the process technology used to manufacture CMOS image sensors is generally compatible with existing CMOS process technologies, the CMOS image sensor may be fabricated at a relatively lower cost point. Due to these and other advantages, CMOS image sensors has been widely adapted for use in a variety of consumer electronic products.

SUMMARY

Embodiments of the inventive concept provide image sensors exhibiting improved electrical characteristics and methods of fabricating same.

According to embodiments of the inventive concept, an image sensor may include; a semiconductor substrate including a first surface and an opposing second surface, a pixel isolation structure in the semiconductor substrate and defining a pixel section, a photoelectric conversion region in the pixel section, a first device isolation layer on the pixel section and defining an active area on the first surface of the semiconductor substrate, a floating diffusion region in the active area and spaced apart from the photoelectric conversion region, a transfer gate electrode on the active area between the photoelectric conversion region and the floating diffusion region, and a second device isolation layer in the active area between the transfer gate electrode and the floating diffusion region.

According to embodiments of the inventive concept, an image sensor may include; a logic chip and a sensor chip on the logic chip, the sensor chip including a light-receiving section, a light-shielding section that surrounds the light-receiving section, and a pad section that surrounds the light-shielding section. The sensor chip may include; a semiconductor substrate of first conductivity type including a first surface and an opposing second surface, a pixel isolation structure in the semiconductor substrate and defining a pixel section, a photoelectric conversion region in the pixel section, a first device isolation layer on the pixel section and defining an active area on the first surface of the semiconductor substrate, a floating diffusion region of second conductivity type, different from the first conductivity type, in the active area and spaced apart from the photoelectric conversion region, a transfer gate electrode on the active area between the photoelectric conversion region and the floating diffusion region, a second device isolation layer in the active area between the transfer gate electrode and the floating diffusion region, an interlayer dielectric layer that covers the first surface of the semiconductor substrate. The image sensor may also include; a wire structure in the interlayer dielectric layer, a microlens on the second surface of the semiconductor substrate on the light-receiving section, and a color filter between the microlens and the semiconductor substrate.

According to embodiments of the inventive concept, an image sensor may include; a semiconductor substrate including a first surface and an opposing second surface, a pixel isolation structure in the semiconductor substrate and defining a pixel section, a photoelectric conversion region in the pixel section, a first device isolation layer on the pixel section and defining an active area on the first surface of the semiconductor substrate, a floating diffusion region in the active area and spaced apart from the photoelectric conversion region, a transfer gate electrode on the active area between the photoelectric conversion region and the floating diffusion region, and a second device isolation layer in the active area between the transfer gate electrode and the floating diffusion region, wherein the transfer gate electrode includes a lower part extending into the semiconductor substrate and an upper part connected to the lower part and protruding upward from the first surface of the semiconductor substrate, and the second device isolation layer contacts the lower part of the transfer gate electrode.

DETAILED DESCRIPTION

Throughout the written description and drawings, like reference numbers and labels are used to denote like or similar components, elements and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom/side; higher/lower; closer/farther; thicker/thinner; proximate/distant; above/below; under/over; upper/lower; center/side; surrounding; overlay/underlay; etc.

Accordingly, and as illustrated in some of the accompanying drawings (see, e.g., FIG. 3), certain embodiments of the inventive concept may be better understood in reference to an arbitrary space defined in terms of a first direction D1 (e.g., a first horizontal direction), a second direction D2 intersecting the first direction D1 (e.g., a second horizontal direction), and a third direction D3 intersecting the first direction D1 and the second direction D2 (e.g., a vertical direction). In this regard, the first direction D1 and the second direction D2 may be substantially parallel to an arbitrarily selected planar surface (e.g., a primary surface of a substrate) and the third direction may be substantially perpendicular to the arbitrarily selected planar surface.

Figure 1:
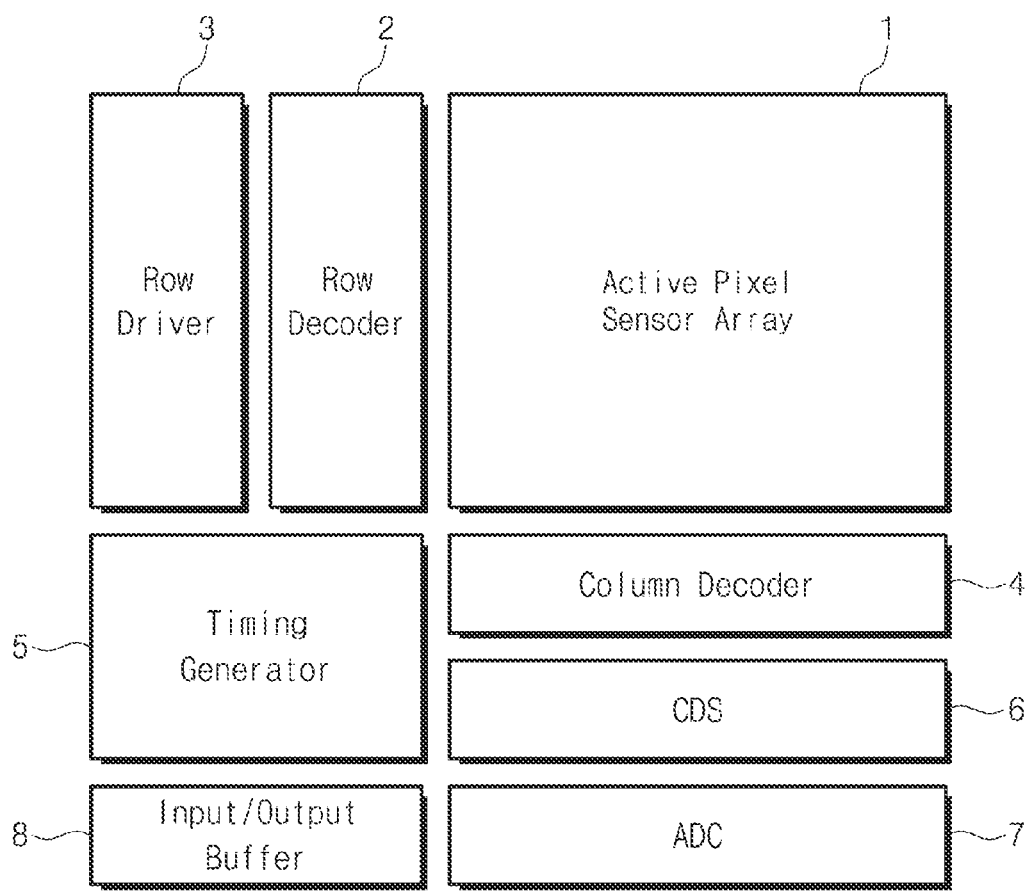
FIG. 1 is block diagram illustrating an image sensor according to embodiments of the inventive concept.

Figure (FIG. 1 is a block diagram illustrating an image sensor according to embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of two-dimensionally arranged unit pixels, each of which is configured to convert optical signals into electrical signals. The active pixel sensor array 1 may be driven by a plurality of drive signals such as a pixel selection signal, a reset signal, and a charge transfer signal from the row driver 3. In addition, the converted electrical signals may be provided for the correlated double sampler 6.

The row driver 3 may provide the active pixel sensor array 1 with several drive signals for driving several unit pixels in accordance with a decoded result obtained from the row decoder 2. When the unit pixels are arranged in a matrix, the drive signals may be provided to each row.

The timing generator 5 may provide the row and column decoders 2 and 4 with timing and control signals.

The correlated double sampler 6 may receive the electrical signals generated in the active pixel sensor array 1, and may hold and sample the received electrical signals. The correlated double sampler 6 may perform a double sampling operation to sample a specific noise level and a signal level of the electrical signal, and then may output a difference level corresponding to a difference between the noise and signal levels.

The analog-to-digital converter 7 may convert analog signals, which correspond to the difference level received from the correlated double sampler 6, into digital signals, and then may output the converted digital signals.

The I/O buffer 8 may latch the digital signals and then may sequentially output the latched digital signals to an image signal processor (not shown) in response to the decoded result obtained from the column decoder 4.

Figure 2:
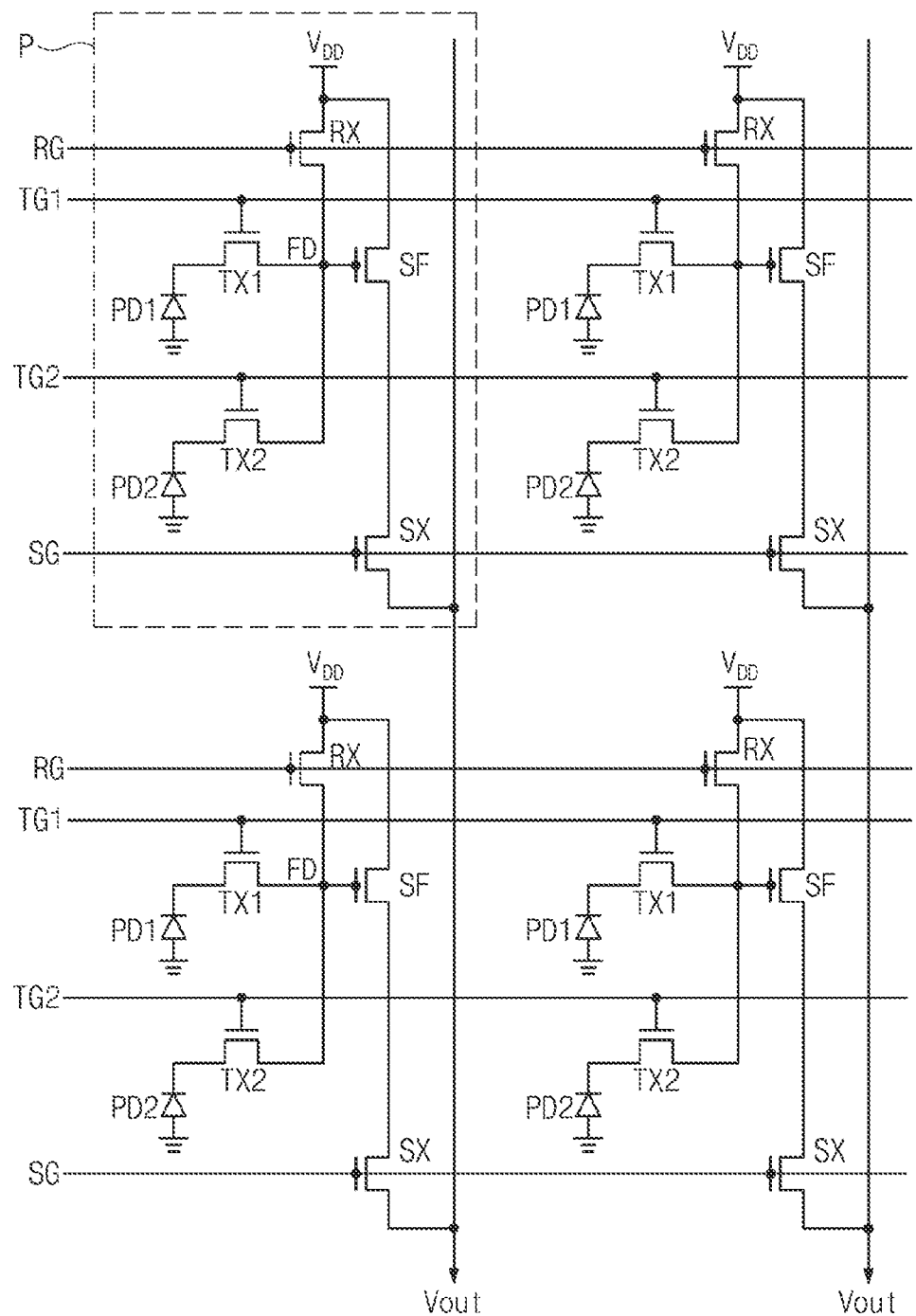
FIG. 2 is a circuit diagram further illustrating in one example the active pixel sensor array of FIG. 1.

FIG. 2 is a circuit diagram illustrating in one example the active pixel sensor array 1 of FIG. 1.

Referring to FIG. 2, the active pixel sensor array 1 may include a plurality of unit pixels P, and the pixels P may be arranged in a matrix along row and column directions. Each of the unit pixels P may include first and second photoelectric conversion elements PD1 and PD2, transfer transistors TX1 and TX2, and logic transistors RX, SX, and SF. The logic transistors RX, SX and SF may include a reset transistor RX, a selection transistor SX, and a source follower transistor SF. Gate electrodes of first and second transfer transistors TX1 and TX2, the reset transistor RX, and the selection transistor SX may be correspondingly connected to driver signal lines TG1, TG2, RG, and SG.

The first transfer transistor TX1 may include a first transfer gate TG1 and a first photoelectric conversion element PD1, and the second transfer transistor TX2 may include a second transfer gate TG2 and a second photoelectric conversion element PD2. The first and second transfer transistors TX1 and TX2 may share a charge detection node FD or a floating diffusion region.

The first and second photoelectric conversion elements PD1 and PD2 may generate and accumulate photo-charge (hereafter, "charge") in proportion to an amount (e.g., a level or magnitude) of externally incident light. The first and second photoelectric conversion elements PD1 and PD2 may be one of a photodiode, a phototransistor, a photo-gate, a pinned photodiode (PPD), and any combination thereof.

The first and second transfer gates TG1 and TG2 may transfer charge accumulated in the first and second photoelectric conversion elements PD1 and PD2 to the charge detection node FD (i.e., the floating diffusion region). The first and second transfer gates TG1 and TG2 may receive complementary signals. For example, the charge may be transferred to the charge detection node FD from one of the first and second photoelectric conversion elements PD1 and PD2.

The charge detection node FD may receive and accumulatively store the charge generated from the first and second photoelectric conversion elements PD1 and PD2. The source follower transistor SF may be controlled by an amount of charge accumulated in the charge detect node FD.

The reset transistor RX may periodically reset the charge accumulated in the charge detection node FD. For example, the reset transistor RX may have a drain electrode connected to the charge detection node FD and a source electrode connected to a power voltage $V_{DD}$. When the reset transistor RX is turned ON, the charge detection node FD may receive the power voltage $V_{DD}$ connected to the source electrode of the reset transistor RX. Accordingly, when the reset transistor RX is turned ON, the charge accumulated in the charge detection node FD may be exhausted and thus the charge detection node FD may be reset.

The source follower transistor SF may amplify a variation in electrical potential of the charge detection node FD, and may output the amplified signal or a pixel signal through the selection transistor SX to an output line $V_{OUT}$. The source follower transistor SF may be a source follower buffer amplifier that generates a source-drain current in proportion to an amount of charge applied to a gate electrode. The source follower transistor SF may include a gate electrode connected to the charge detection node FD, a drain electrode connected to the power voltage $V_{DD}$, and a source electrode connected to a drain electrode of the selection transistor SX.

The selection transistor SX may select each row of the unit pixel P to be readout. When the selection transistor SX is turned ON, the power voltage $V_{DD}$ connected to the drain electrode of the source follower transistor SF may be transmitted to the drain electrode of the selection transistor SX.

Figure 3:
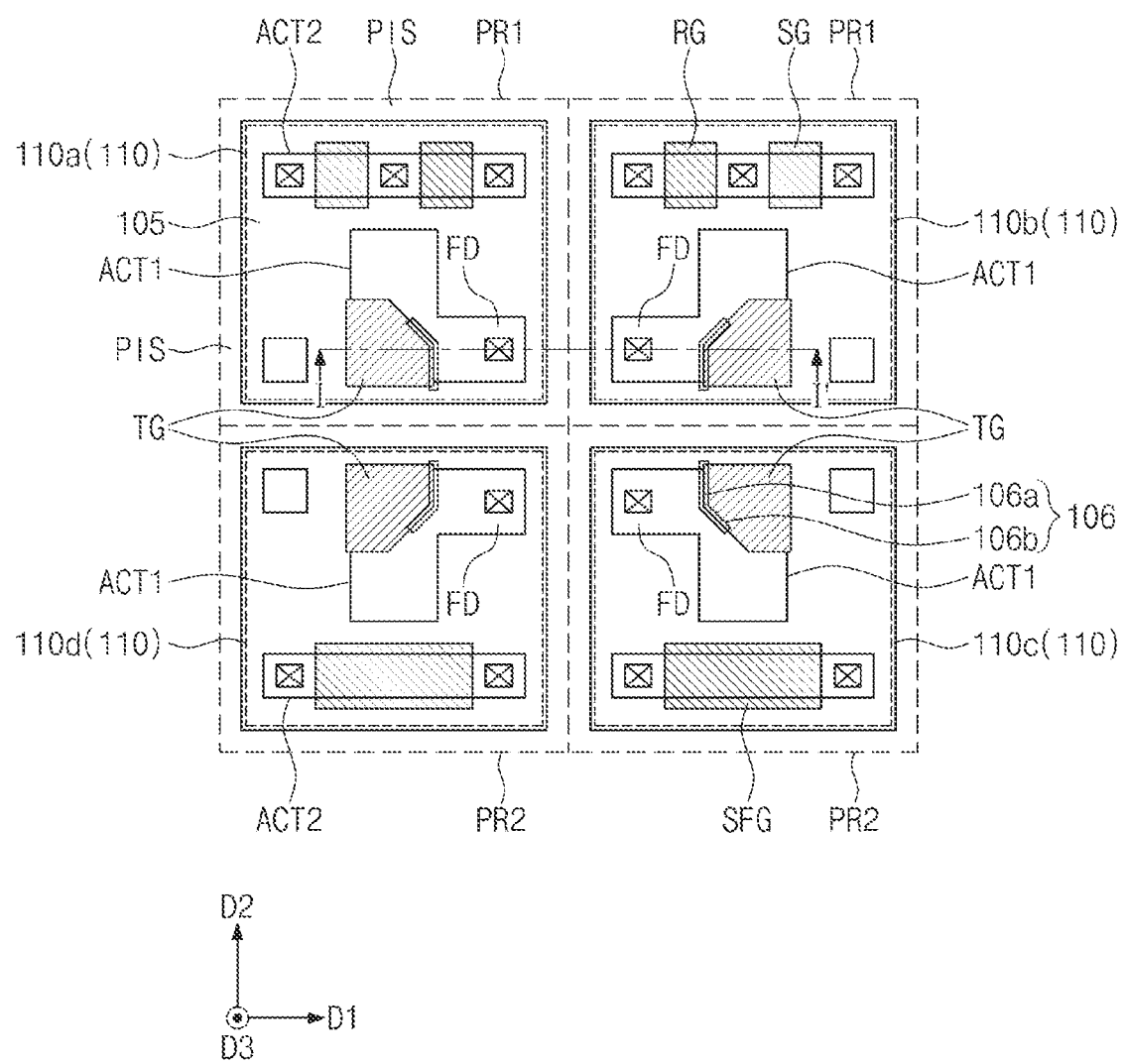
FIG. 3 is a plan (or top-down) view illustrating an image sensor according to embodiments of the inventive concept.
Figure 4:
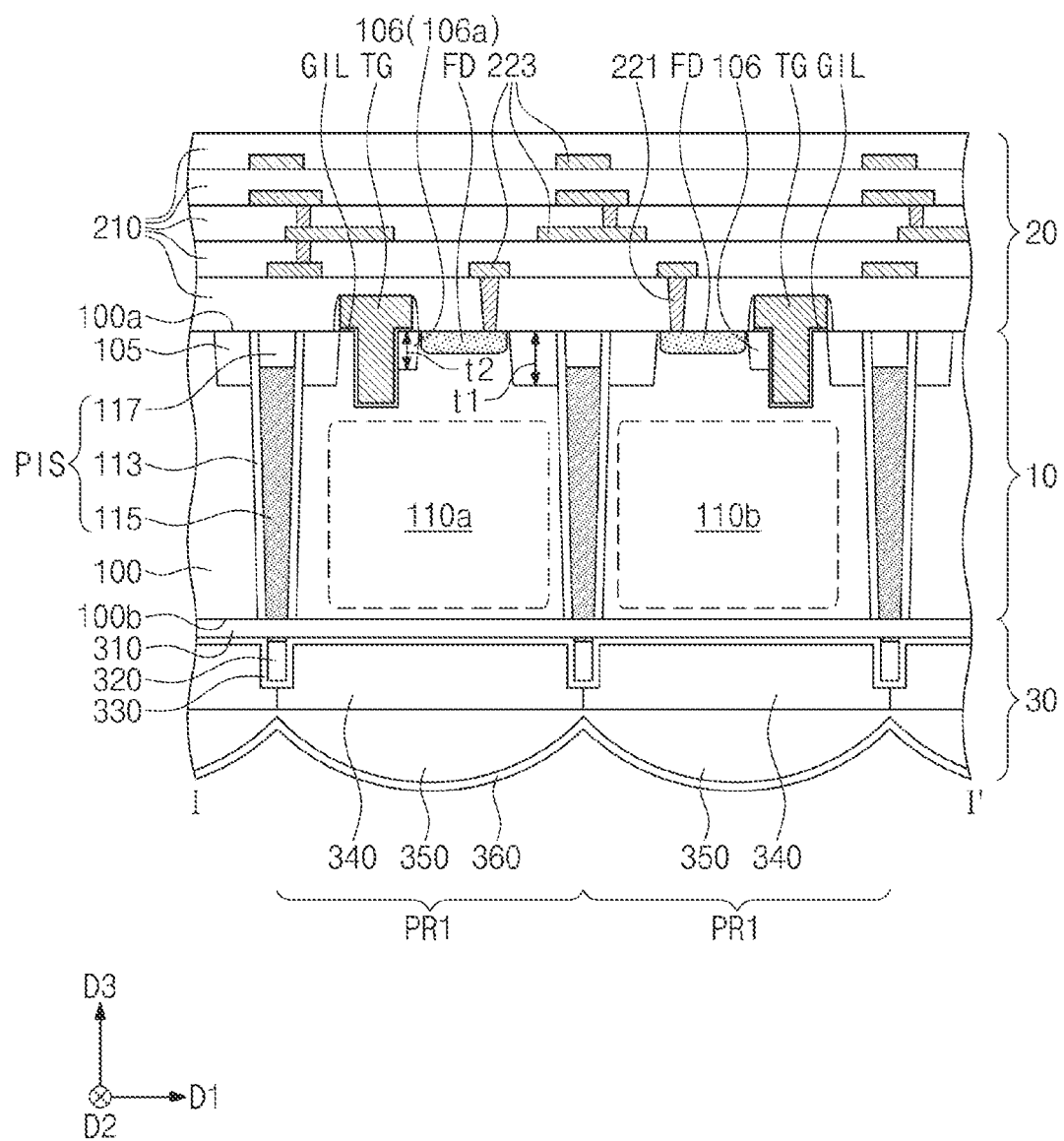
FIGS. 4, 5, and 6 are respective cross-sectional views taken along line I-I' of FIG. 3 and further illustrating an image sensor according to embodiments of the inventive concept.

FIG. 3 is a plan view illustrating an image sensor according to embodiments of the inventive concept, and FIG. 4 is a cross-sectional view taken along line I-I' of FIG. 3.

Referring to FIGS. 3 and 4, an image sensor according to embodiments of the inventive concept may include a photoelectric conversion layer 10, a readout circuit layer 20, and an optical transmission layer 30. The photoelectric conversion layer 10 may be provided between the readout circuit layer 20 and the optical transmission layer 30.

The photoelectric conversion layer 10 may include a semiconductor substrate 100, a pixel isolation structure PIS that defines first and second pixel sections PR1 and PR2, and photoelectric conversion regions 110 provided in the first and second pixel sections PR1 and PR2. The photoelectric conversion regions 110 may convert externally incident light into electrical signals. For example, each of the first pixel sections PR1 may include either a first photoelectric conversion region 110a or a second photoelectric conversion region 110b, and each of the second pixel sections PR2 may include either a third photoelectric conversion region 110c or a fourth photoelectric conversion region 110d. Although the first, second, third, and fourth photoelectric conversion regions 110a, 110b, 110c, 110d are shown arranged in a clockwise direction, this configuration is provided for purposes of exemplary illustration, and the scope of the inventive concept are not limited thereto.

The readout circuit layer 20 may include readout circuits (e.g., metal oxide semiconductor (MOS) transistors) connected to the photoelectric conversion layer 10. The readout circuit layer 20 may process electrical signals provided by (e.g., converted in) the photoelectric conversion layer 10.

The optical transmission layer 30 may include microlenses 350 arranged in a matrix, and may also include color filters 340 between the microlenses 350 and the semiconductor substrate 100. The color filters 340 may include red, green, and blue filters depending on a unit pixel. In other embodiments, one or more of the color filters 340 may include an infrared filter.

The semiconductor substrate 100 may include an upper (e.g., a first or front) surface 100a and an opposing lower (e.g., a second or rear) surface 100b. The semiconductor substrate 100 may include, for example, an epitaxial layer having a first conductivity type (e.g., a P-type) or a bulk semiconductor substrate including a first conductivity type well.

The pixel isolation structure PIS may extend in a third direction D3 between the first and second surfaces 100a and 100b of the semiconductor substrate 100. The pixel isolation structure PIS may have a width in a first direction D1, and the width in the first direction D1 may be greater on the first surface 100a than on the second surface 100b. The pixel isolation structure PIS may have a width that gradually decreases in a direction from the first surface 100a and towards the second surface 100b of the semiconductor substrate 100.

The pixel isolation structure PIS may define the first and second pixel sections PR1 and PR2. Referring to FIG. 3, the pixel isolation structure PIS may surround the first and second pixel sections PR1 and PR2, and may separate the first and second pixel sections PR1 and PR2 in the first direction D1 and/or the second direction D2. In this regard, the first and second pixel sections PR1 and PR2 may be two-dimensionally arranged in the first and second directions D1 and D2. The pixel isolation structure PIS may include first parts extending in the first direction D1, second parts extending across the first parts in the second direction D2, such that the first and second parts intersect one another to form respective intersection parts.

The pixel isolation structure PIS may include a liner dielectric pattern 113, a semiconductor pattern 115, and a capping dielectric pattern 117. The semiconductor pattern 115 may penetrate in the third direction D3 into at least a portion of the semiconductor substrate 100. The liner dielectric pattern 113 may be provided between the semiconductor pattern 115 and the semiconductor substrate 100. The capping dielectric pattern 117 may be provided on the semiconductor pattern 115.

The semiconductor pattern 115 may have a lower surface at substantially the same level as that of the second surface 100b of the semiconductor substrate 100. The semiconductor pattern 115 may have a upper surface in direct contact with a lower surface of the capping dielectric pattern 117. An air gap or a void may be present in the semiconductor pattern 115. The semiconductor pattern 115 may include, for example, polysilicon.

The lower surface of the capping dielectric pattern 117 may be disposed at a level the same as or lower than that of a lower surface of a first device isolation layer 105 as described hereafter. The capping dielectric pattern 117 may have a rounded shape on the lower surface thereof. The capping dielectric pattern 117 may have a upper surface disposed at the substantially the same as that of a upper surface of a first device isolation layer 105 (or that of the first surface 100a of the semiconductor substrate 100). The liner dielectric pattern 113 may conformally cover a sidewall of the semiconductor pattern 115 and a sidewall of the capping dielectric pattern 117 (or may have a substantially uniform thickness). The liner dielectric pattern 113 and the capping dielectric pattern 117 may include, for example, one or more of silicon oxide, silicon oxynitride, and silicon nitride.

A first device isolation layer 105 may define first and second active areas ACT1 and ACT2 on the first surface 100a of the semiconductor substrate 100 on each of the first and second pixel sections PR1 and PR2. On each of the first and second pixel sections PR1 and PR2, the first and second active areas ACT1 and ACT2 may be spaced apart from each other and may have different sizes.

A transfer gate electrode TG may be provided on the first active area ACT1 of each of the first and second pixel sections PR1 and PR2. At least a portion of the transfer gate electrode TG may be provided in a vertical trench that is recessed from the first surface 100a of the semiconductor substrate 100. The transfer gate electrode TG may include a lower part extending into the semiconductor substrate 100, and may also include an upper part that connects with the lower part and protrudes upwardly from the first surface 100a of the semiconductor substrate 100. The upper part of the transfer gate electrode TG may cover at least a portion of a upper surface of a second device isolation layer 106 as described hereafter in some additional detail.

The lower part of the transfer gate electrode TG may penetrate into at least a portion of the semiconductor substrate 100. The transfer gate electrode TG may have a lower surface disposed at a lower level than that of the first surface 100a of the semiconductor substrate 100. For example, the lower surface of the transfer gate electrode TG may be disposed at a lower level than that of the lower surface of the first device isolation layer 105. In this case, the lower surface of the first device isolation layer 105 may be closer than the lower surface of the transfer gate electrode TG to the first surface 100a of the semiconductor substrate 100. A gate dielectric layer GIL may be interposed between the transfer gate electrode TG and the semiconductor substrate 100.

A second device isolation layer 106 may be provided in the first active area ACT1 on one side of the transfer gate electrode TG. The second device isolation layer 106 may be spaced apart in the first direction D1 from the first device isolation layer 105. The second device isolation layer 106 may be provided between the transfer gate electrode TG and a floating diffusion region FD—as described in some additional detail hereafter, and may physical and electrically separate the transfer gate electrode TG and the floating diffusion region FD from each other. In this regard, the second device isolation layer 106 may inhibit or prevent a gate induced drain leakage (GIDL) phenomenon produced due to an electrical field between the transfer gate electrode TG and the floating diffusion region FD.

Referring to FIG. 3, the second device isolation layer 106 may surround at least a portion of the transfer gate electrode TG. For example, the second device isolation layer 106 may include a first part 106a that extends in the second direction D2 and a second part 106b that extends in a diagonal direction intersecting the first and second directions D1 and D2. The first and second parts 106a and 106b may be connected to each other. The first and second parts 106a and 106b of the second device isolation layer 106 may extend while making an angle of about 90 degrees to about 180 degrees. This, however, is merely an example, and the inventive concept are not limited thereto. For example, the second device isolation layer 106 may have various shapes as described in relation to FIGS. 7 and 8.

The second device isolation layer 106 may have a lower surface disposed at a higher level than that of the lower surface of the first device isolation layer 105. For example, a maximum thickness t2 in the third direction D3 of the second device isolation layer 106 may be less than a maximum thickness t1 in the third direction D3 of the first device isolation layer 105. The first and second device isolation layers 105 and 106 may include a dielectric material. For example, the first and second device isolation layers 105 and 106 may include one or more of silicon oxide, silicon nitride, and silicon oxynitride.

A floating diffusion region FD may be provided in the first active area ACT1 between the second device isolation layer 106 and a portion of the first device isolation layer 105 that is adjacent in the first direction D1 to the second device isolation layer 106. The floating diffusion region FD may be an impurity region whose conductivity type is different from that of the semiconductor substrate 100. The floating diffusion region FD may include impurities having a second conductivity type (e.g., an N-type) different from the first conductivity type (e.g., P-type). The floating diffusion region FD may be spaced apart in the first direction D1 from the transfer gate electrode TG across the second device isolation layer 106. The floating diffusion region FD may have a lower surface disposed at a level higher than the lower surface of the first device isolation layer 105 and also higher than the lower surface of the second device isolation layer 106.

The photoelectric conversion region 110 may be provided in the semiconductor substrate 100 on each of the first and second pixel sections PR1 and PR2. The photoelectric conversion region 110 may generate charge in proportion to magnitude of incident light. The photoelectric conversion region 110 may be an impurity region whose conductivity type is different from that of the semiconductor substrate 100. The photoelectric conversion region 110 may include impurities having the second conductivity type different from the first conductivity type. A photodiode may be formed at a junction between the semiconductor substrate 100 having the first conductivity type and the photoelectric conversion region 110 having the second conductivity type. The photoelectric conversion region 110 may produce charge from light that is incident through the second surface 100b of the semiconductor substrate 100. As may be appreciated from the various cross-sectional views, the semiconductor substrate 100 of the first pixel sections PR1 is provided therein with only the first photoelectric conversion region 110a and the second photoelectric conversion region 110b, but the elements, components and/or features illustrated in the accompanying drawings and described herein may be substantially similar to the third photoelectric conversion region 110c and the fourth photoelectric conversion region 110d.

The second active area ACT2 of each of the first pixel sections PR1 may include a reset gate electrode RG and a selection gate electrode SG, and the second active area ACT2 of each of the second pixel sections PR2 may include a source follower gate electrode SFG. Although not shown, likewise the gate dielectric layer GIL provided between the semiconductor substrate 100 and the transfer gate electrode TG of FIG. 4, a gate dielectric layer may be provided between the semiconductor substrate 100 and each of the reset gate electrode RG, the selection gate electrode SG, and the source follower gate electrode SFG.

A plurality of source/drain impurity regions may be provided in the second active area ACT2 on opposite sides of each of the reset gate electrode RG, the selection gate electrode SG, and the source follower gate electrode SFG. A plurality of contact plugs may be coupled to the source/drain impurity regions.

A plurality of interlayer dielectric layers 210 may be stacked on the first surface 100a of the semiconductor substrate 100, and the interlayer dielectric layers 210 may cover the transfer gate electrode TG and the MOS transistors included in the readout circuits. The interlayer dielectric layers 210 may include, for example, one or more of silicon oxide, silicon nitride, and silicon oxynitride.

The interlayer dielectric layers 210 may have therein wire structures 221 and 223 connected to the readout circuits. The wire structures 221 and 223 may include metal lines 223 and contact plugs 221 that connect the metal lines 223 to each other. One of the contact plugs 221 may be electrically coupled to (e.g., contact) the floating diffusion region FD.

The optical transmission layer 30 may be provided on the second surface 100b of the semiconductor substrate 100. The optical transmission layer 30 may include a planarized dielectric layer 310, a grid structure 320, a protection layer 330, color filters 340, microlenses 350, and a coating layer 360.

The planarized dielectric layer 310 may include a plurality of dielectric layers having different refractive indices, and each of the dielectric layers may include a transparent dielectric material. The dielectric layers may be combined to an appropriate thickness to have a high transmittance. For example, the planarized dielectric layer 310 may include metal oxide, such as aluminum oxide and/or hafnium oxide.

The grid structure 320 may be provided on the planarized dielectric layer 310. Referring to FIG. 3, the grid structure 320 may have a similar shape to that of the pixel isolation structure PIS. The grid structure 320 may overlap in the third direction D3 with the pixel isolation structure PIS. For example, the grid structure 320 may include first parts that extend in the first direction D1, and may also include second parts that extend in the second direction D2 while running across the first parts. The grid structure 320 may have a width substantially the same as or less than a minimum width of the pixel isolation structure PIS.

The grid structure 320 may include one or more of a light-shielding pattern and a low-refractive pattern. The light-shielding pattern may include a metallic material, such as titanium, tantalum, or tungsten. The low-refractive pattern may include a material whose refractive index is less than that of the conductive pattern. The low-refractive pattern may include an organic material and may have a refractive index of about 1.1 to about 1.3. For example, the grid structure 320 may include a polymer layer including silicon nano-particles.

The protection layer 330 may conformally cover a surface of the planarized dielectric layer 310 and a surface of the grid structure 320 (or may have a substantially uniform thickness). The protection layer 330 may have a single-layered or multi-layered structure including, for example, one or more of aluminum oxide and silicon carbon oxide.

The color filters 340 may be provided corresponding to the first and second pixel sections PR1 and PR2. The color filters 340 may fill spaces defined by the grid structure 320. Based on a unit pixel, the color filter 340 may include one of red, green, and blue filters or one of magenta, cyan, and yellow filters.

The color filters 340 may be provided thereon with the microlenses 350 that correspond to the first and second pixel sections PR1 and PR2. The microlenses 350 may each have on its one surface a convex shape to concentrate light that is incident on each of the first and second pixel sections PR1 and PR2. The coating layer 360 may conformally cover a convex surface of each of the microlenses 350 (or may have a substantially uniform thickness). For example, the microlenses 350 may include a photoresist material, a thermosetting resin, or a light-transmissive resin, and the coating layer 360 may include a dielectric material (e.g., inorganic oxide) capable of protecting the microlenses 350.

Figure 5:
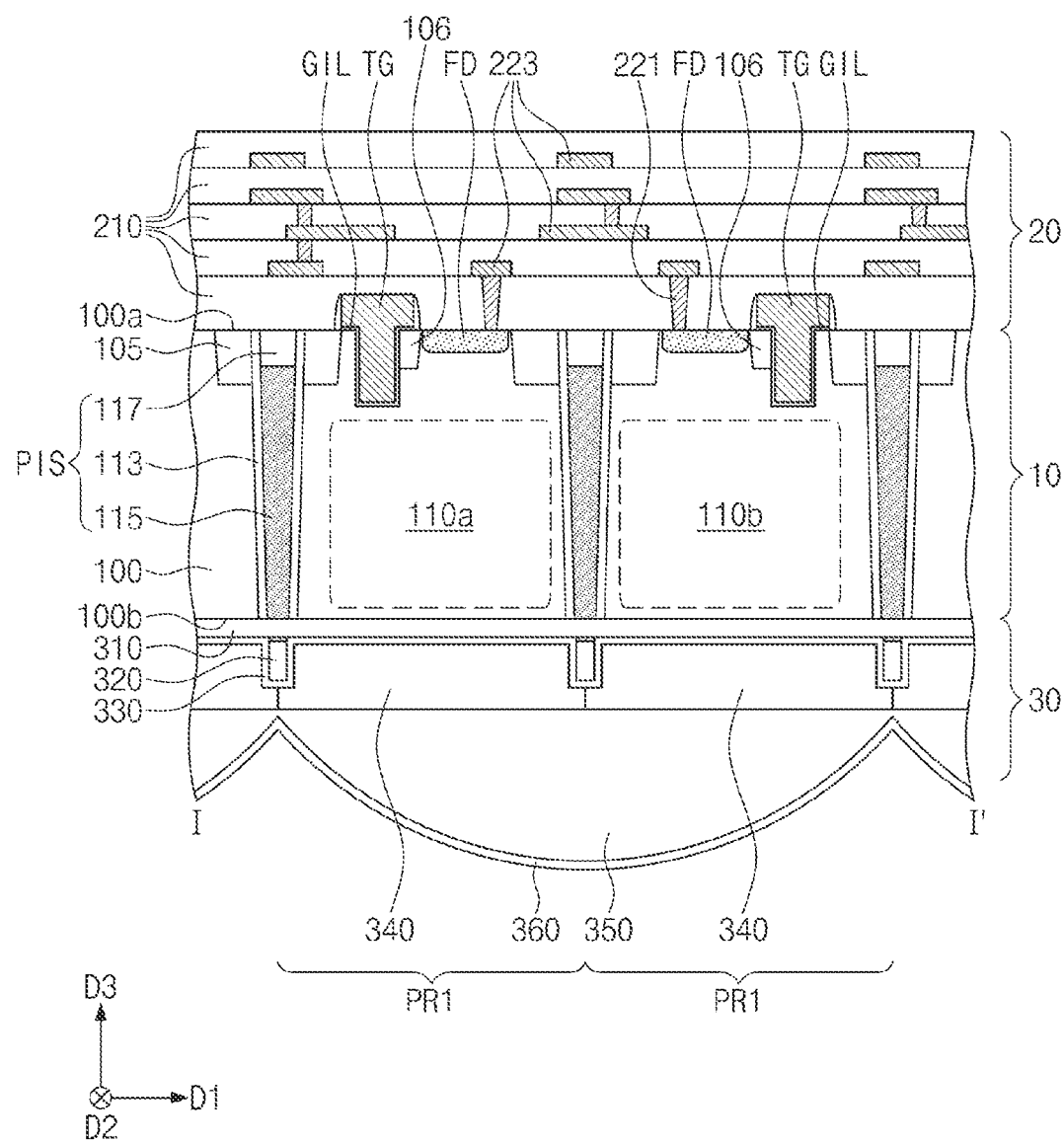

FIG. 5 is a cross-sectional view taken along line I-I' of FIG. 3 and may be considered by way of comparison with the embodiment illustrated in FIG. 4.

Referring to FIGS. 3, 4 and 5, a single microlens 350 may be provided corresponding to a plurality of first and second pixel sections PR1 and PR2. For example, a single microlens 350 may be provided in common to four color filters 340 and four pixel sections (or, the first and second pixel sections PR1 and PR2).

Figure 6:
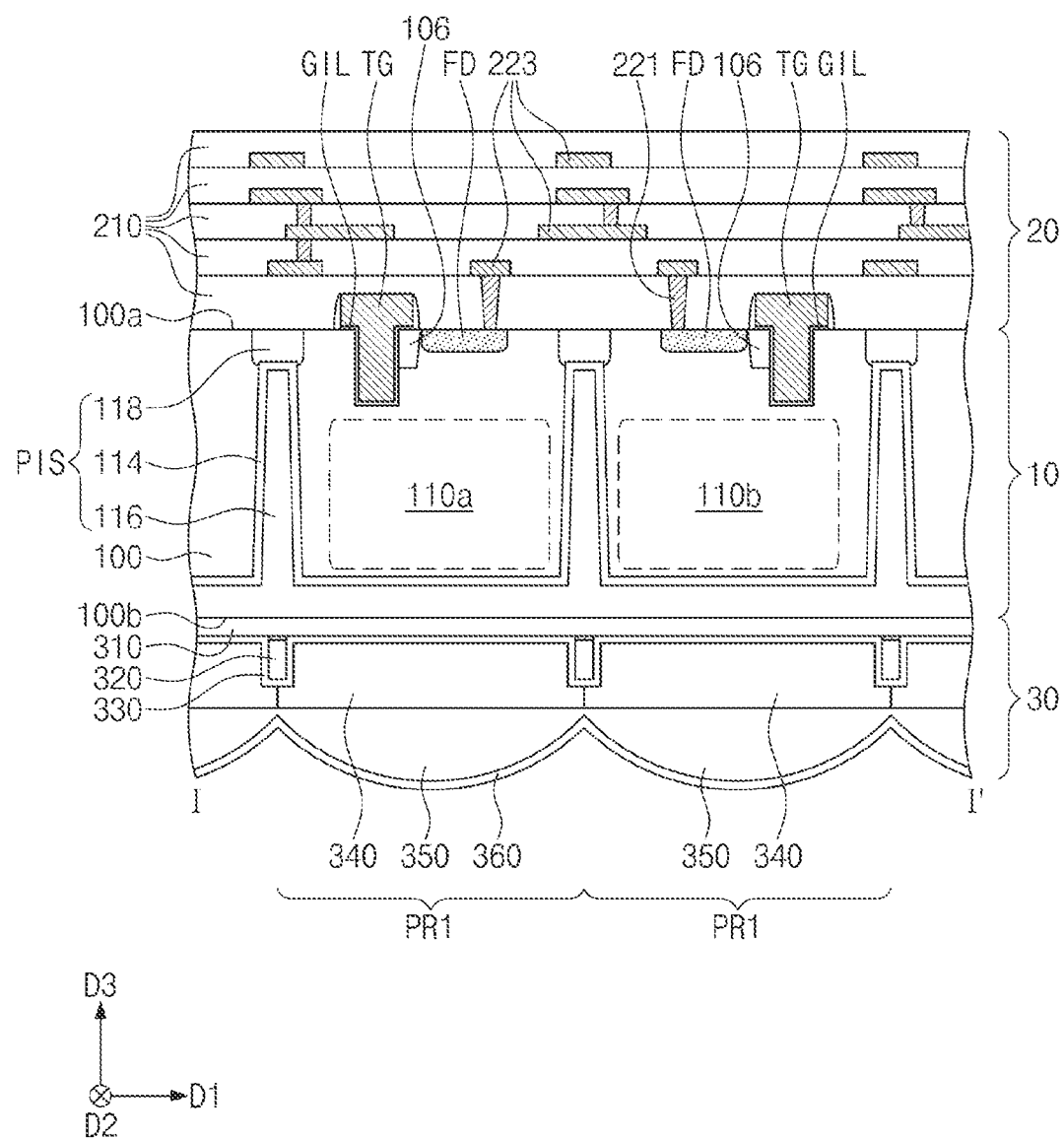

FIG. 6 is another cross-sectional view taken along line I-I' of FIG. 3 and may be considered by way of comparison to the embodiment of FIG. 4.

Referring to FIGS. 3, 4 and 6, the pixel isolation structure PIS may include a liner dielectric pattern 114, a separation dielectric pattern 116, and a capping dielectric pattern 118. A portion of the separation dielectric pattern 116 may penetrate in the third direction D3 with at least a portion of the semiconductor substrate 100. The liner dielectric pattern 114 may be provided between the separation dielectric pattern 116 and the semiconductor substrate 100. The capping dielectric pattern 118 may be provided on the separation dielectric pattern 116.

The separation dielectric pattern 116 may include a first part that extends along the second surface 100b of the semiconductor substrate 100, and may also include second parts that extend along the third direction D3 and penetrate the semiconductor substrate 100. In contrast to the pixel isolation structure PIS previously described in relation to FIG. 4, the second part of the separation dielectric pattern 116 may have a width that gradually increases in a direction from the first surface 100a to the second surface 100b of the semiconductor substrate 100. For example, a width in the first direction D1 of the second part adjacent to the first surface 100a may be less than that in the first direction D1 of the second part adjacent to the second surface 100b.

In addition, in contrast to the semiconductor pattern 115 of the pixel isolation structure PIS previously described in relation to FIG. 4, the separation dielectric pattern 116 may not include a conductive material or a crystalline semiconductor material.

Figure 7:
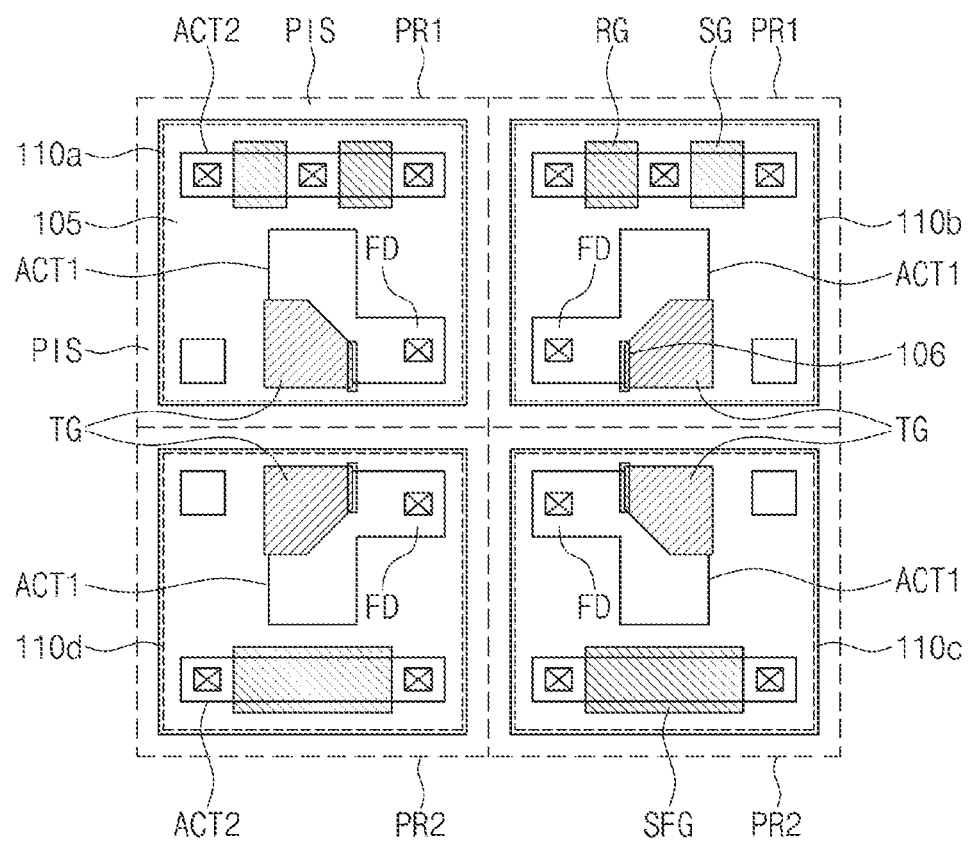
FIGS. 7 and 8 are respective plan views illustrating an image sensor according to embodiments of the inventive concept.
Figure 8:
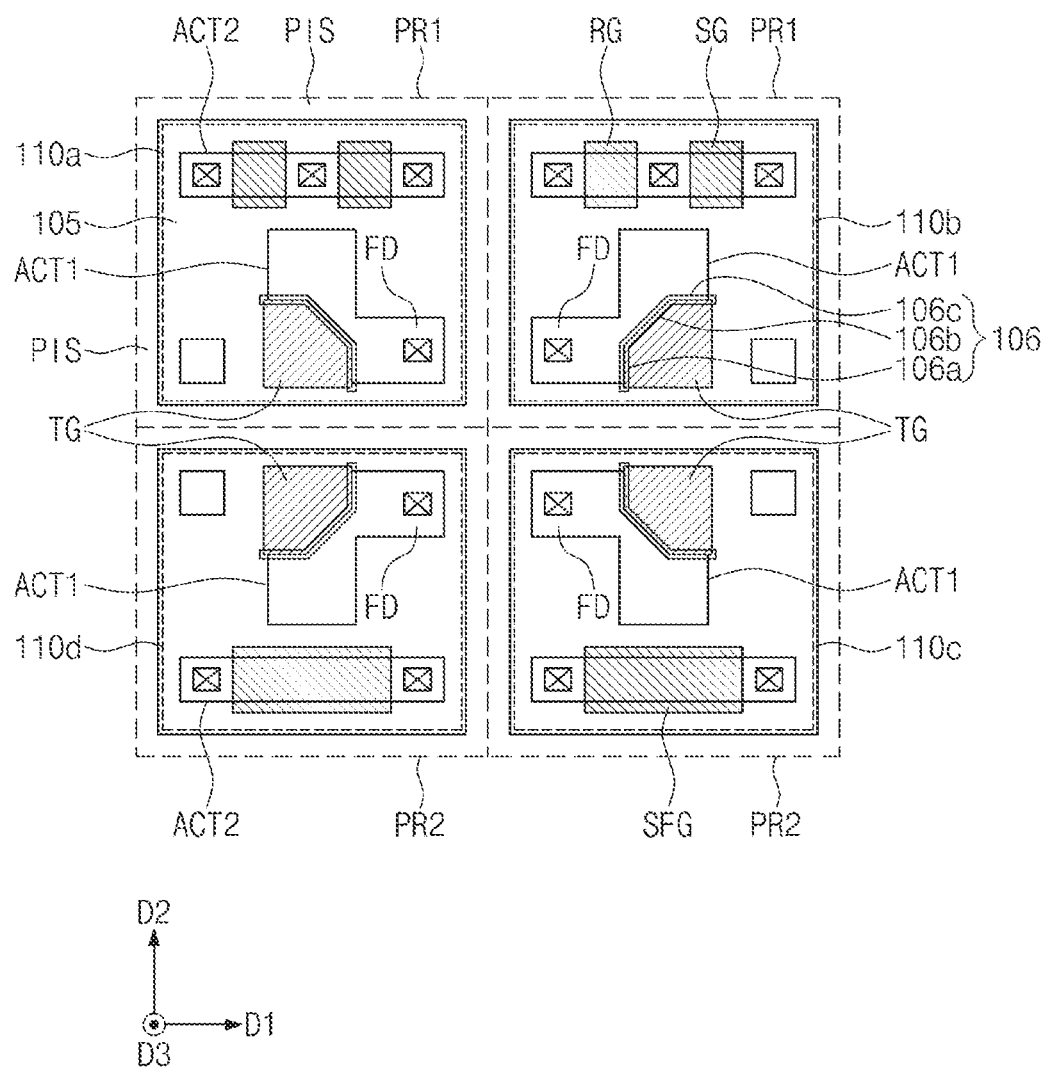

FIGS. 7 and 8 are respective plan views illustrating image sensors according to embodiments of the inventive concept, and may be considered by way of comparison with the embodiment of FIG. 3.

Referring to FIG. 7, the second device isolation layer 106 may surround at least a portion of the transfer gate electrode TG and may extend in the second direction D2. For example, when the transfer gate electrode TG has a plurality of lateral surfaces between which is formed an angle of about 90 degrees to about 180 degrees, the second device isolation layer 106 may surround only one lateral surface of the transfer gate electrode TG.

Referring to FIG. 8, the device isolation layer 106 may surround entire lateral surfaces of the transfer gate electrode TG adjacent to the first active area ACT1. For example, the second device isolation layer 106 may include a first part 106a that extends in the second direction D2, a second part 106b that extends in a diagonal direction intersecting the first and second directions D1 and D2, and a third part 106c that extends in the first direction D1. The second part 106b may connect the first and third parts 106a and 106c to each other. For example, the first part 106a may be connected to one end of the second part 106b, and the third part 106c may be connected to another end opposite to the one end of the second part 106b.

Figure 9:
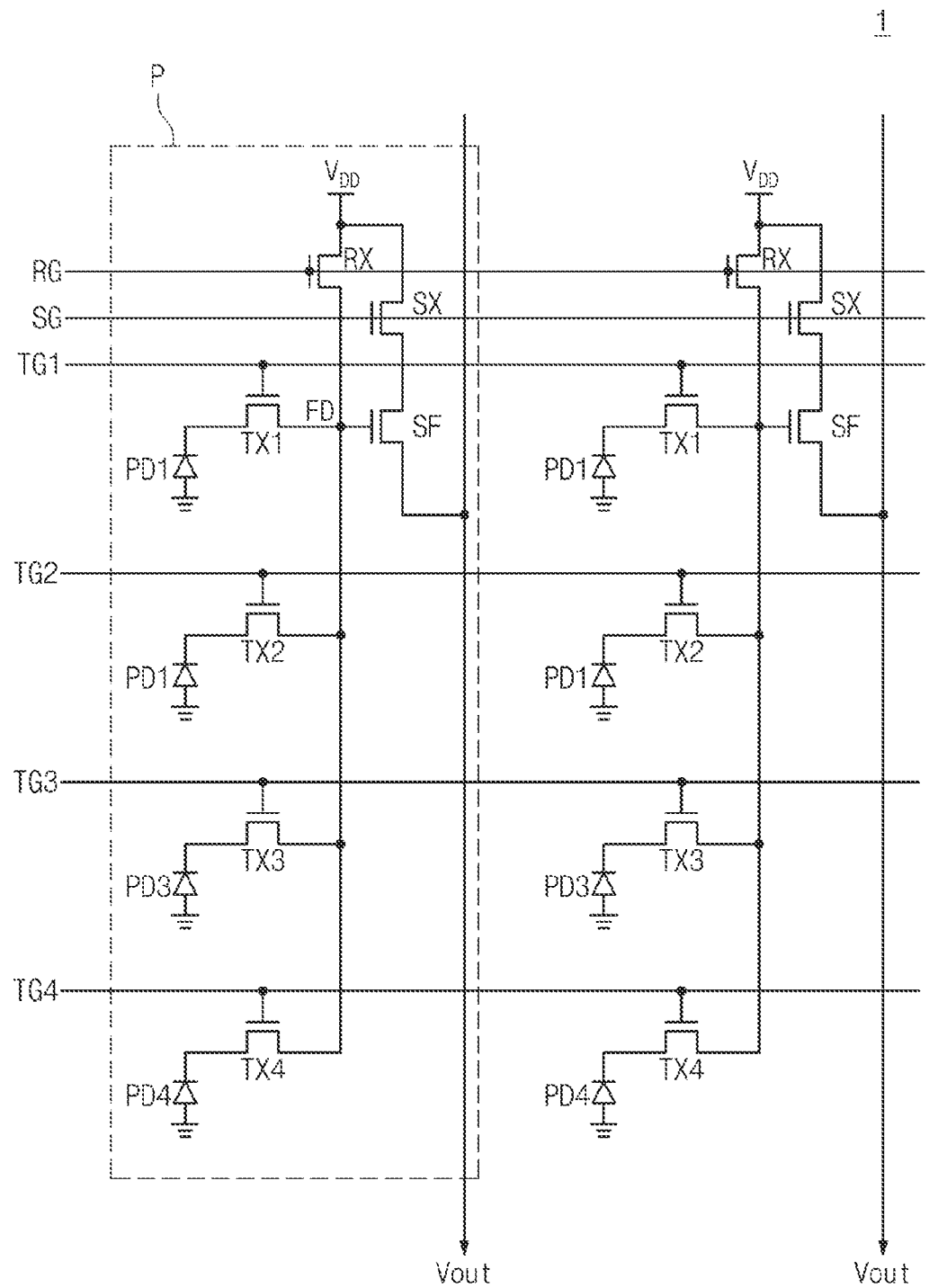
FIG. 9 is a circuit diagram illustrating an active pixel sensor array of an image sensor according to embodiments of the inventive concept.

FIG. 9 is a circuit diagram illustrating an active pixel sensor array of an image sensor according to embodiments of the inventive concept, and may be considered by way of comparison with the embodiment of FIG. 2.

Referring to FIG. 9, the active pixel sensor array 1 may include a plurality of unit pixels P, and each of the unit pixels P may include four transfer transistors TX1, TX2, TX3, and TX4. The four transfer transistors TX1, TX2, TX3, and TX4 may share a charge detection node FD and logic transistors RX, SX, and SF.

A selection signal may select each row of the unit pixel P to be readout. Based on signals applied to first to fourth transfer gate electrodes TG1, TG2, TG3, and TG4, charge may be transferred to the charge detection node FD from one of first, second, third, and fourth photoelectric conversion elements PD1, PD2, PD3, and PD4.

Figure 10:
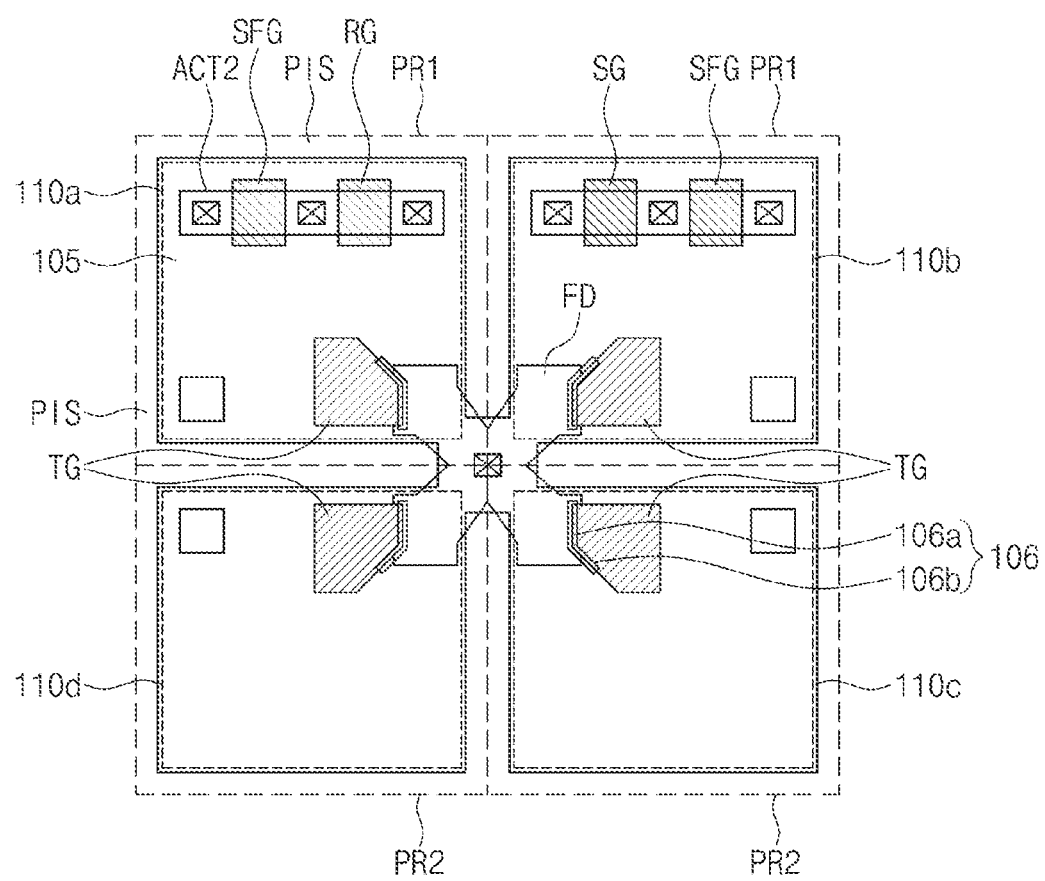
FIG. 10 is a plan view illustrating an image sensor according to embodiments of the inventive concept.

FIG. 10 is a plan view illustrating an image sensor according to embodiments of the inventive concept, and may be considered by way of comparison with the embodiment of FIG. 3.

Referring to FIG. 10, the floating diffusion region FD may be provided on a central portion between four pixel sections (or, the first and second pixel sections PR1 and PR2). Referring to FIG. 10, the floating diffusion region FD may have an 'X' shape. For example, the floating diffusion region FD may extend toward neighboring first, second, third, and fourth photoelectric conversion regions 110a, 110b, 110c, and 110d in diagonal directions that intersect the first and second directions D1 and D2. The floating diffusion region FD may overlap in the third direction D3 with a portion of each of the first, second, third, and fourth photoelectric conversion regions 110a, 110b, 110c, and 110d.

However, the foregoing is merely one example, and the scope of the inventive concept are not limited thereto. For example, the floating diffusion region FD may have a circular shape, a polygonal shape, or any other suitable shape. In some embodiments, the transfer gate electrode TG may have shape that completely surrounds the floating diffusion region FD. The transfer gate electrode TG that surrounds the floating diffusion region FD may overlap in the third direction D3 with a portion of each of the first, second, third, and fourth photoelectric conversion regions 110a, 110b, 110c, and 110d. When the transfer gate electrode TG has a shape that completely surrounds the floating diffusion region FD, the second device isolation layer 106 may be formed on the whole on a boundary between the transfer gate electrode TG and the floating diffusion region FD.

FIGS. 11 to 17 are related cross-sectional views taken along line I-I' of FIG. 3 and illustrate in one example a method of fabricating an image sensor according to embodiments of the inventive concept.

Figure 11:
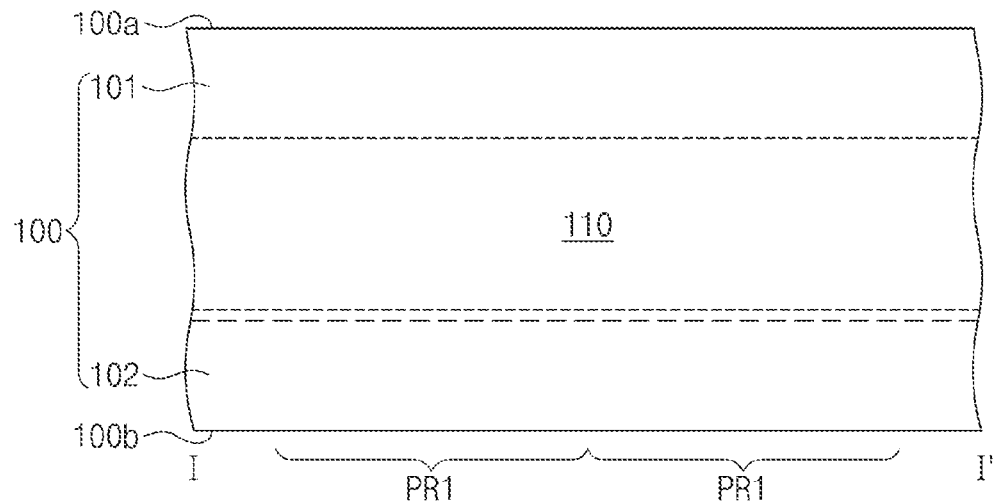
FIGS. 11, 12, 13, 14, 15, 16 and 17 (hereafter collectively, "FIGS. 11 to 17") are related cross-sectional views taken along line I-I' of FIG. 3 and illustrating a method of fabricating an image sensor according to embodiments of the inventive concept.

Referring to FIG. 11, a semiconductor substrate 100 may be provided which has a first conductivity type (e.g., P-type). The semiconductor substrate 100 may have an upper (or first) surface 100a and an opposing lower (or second) surface 100b. The semiconductor substrate 100 may include a first-conductivity-type epitaxial layer 101 formed on a first-conductivity-type bulk silicon substrate 102. In other embodiments, the semiconductor substrate 100 may be a bulk semiconductor substrate including a first conductivity type well.

Yet, in other embodiments, the semiconductor substrate 100 may be a silicon-on-insulation (SOI) substrate, a germanium substrate, a germanium-on-insulator (GOI) substrate, or a silicon-germanium substrate.

The epitaxial layer 101 may be formed by a selective epitaxial growth (SEG) that uses the bulk silicon substrate 102 as a seed, and impurities of the first conductivity type may be doped during the selective epitaxial growth. For example, the epitaxial layer 101 may include P-type impurities.

Thereafter, an impurity region 110 of a second conductivity type may be formed in the epitaxial layer 101. The impurity region 110 may be formed by doping the epitaxial layer 101 with impurities having the second conductivity type (e.g., N-type) different from the first conductivity type. The impurity region 110 may be spaced apart from the first and second surfaces 100a and 100b of the semiconductor substrate 100. The impurity region 110 may be an area including a second-conductivity-type well formed in the epitaxial layer 101.

Figure 12:
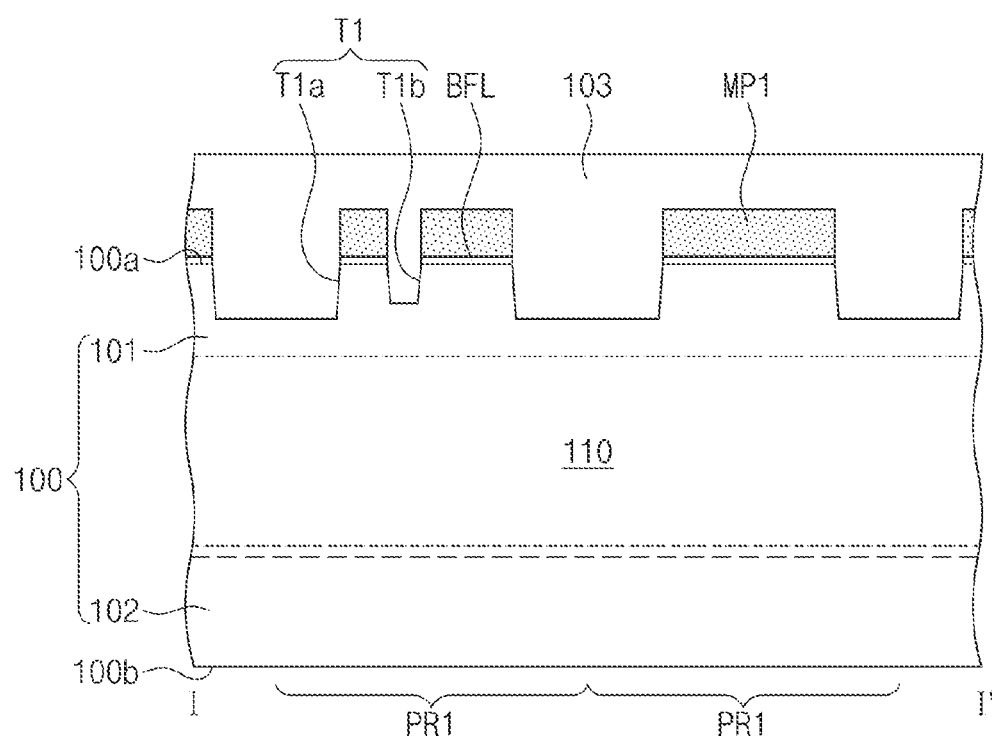

Referring to FIGS. 3 and 12, the semiconductor substrate 100 may be patterned to form a first trench T1. The first trench T1 may extend in a vertical direction that is directed from the first surface 100a toward the second surface 100b of the semiconductor substrate 100. The first trench T1 may include a first part T1a and a second part T1b. The first part T1a of the first trench T1 may have its depth and width greater than those of the second part T1b of the first trench T1.

The first trench T1 may define first and second active areas ACT1 and AC2 of each of first and second pixel sections PR1 and PR2. The formation of the first trench T1 may include forming a buffer layer BFL and a first mask pattern MP1 on the first surface 100a of the semiconductor substrate 100, and using the first mask pattern MP1 as an etching mask to anisotropically etch the semiconductor substrate 100.

The buffer layer BFL may be formed by performing a deposition process or a thermal oxidation process on the first surface 100a of the semiconductor substrate 100. The buffer layer BFL may include, for example, silicon oxide. The first mask pattern MP1 may be formed of, for example, silicon nitride or silicon oxynitride. The first trench T1 may have a lower surface spaced apart from the impurity region 110.

In this regard, the foregoing description assumed that the formation of the impurity region 110 is followed by the formation of the first trench T1. However, in other embodiments, the formation of the first trench T1 may be followed by the formation of the impurity region 110.

Thereafter, a buried dielectric layer 103 may be formed to substantially fill the first trench T1. The buried dielectric layer 103 may be formed by depositing a dielectric material having a large thickness (e.g., to cover a upper surface of the first mask pattern MP1) on the semiconductor substrate 100 in which the first trench T1 is formed. The buried dielectric layer 103 may cover the first mask pattern MP1 while filling the first trench T1.

Figure 13:
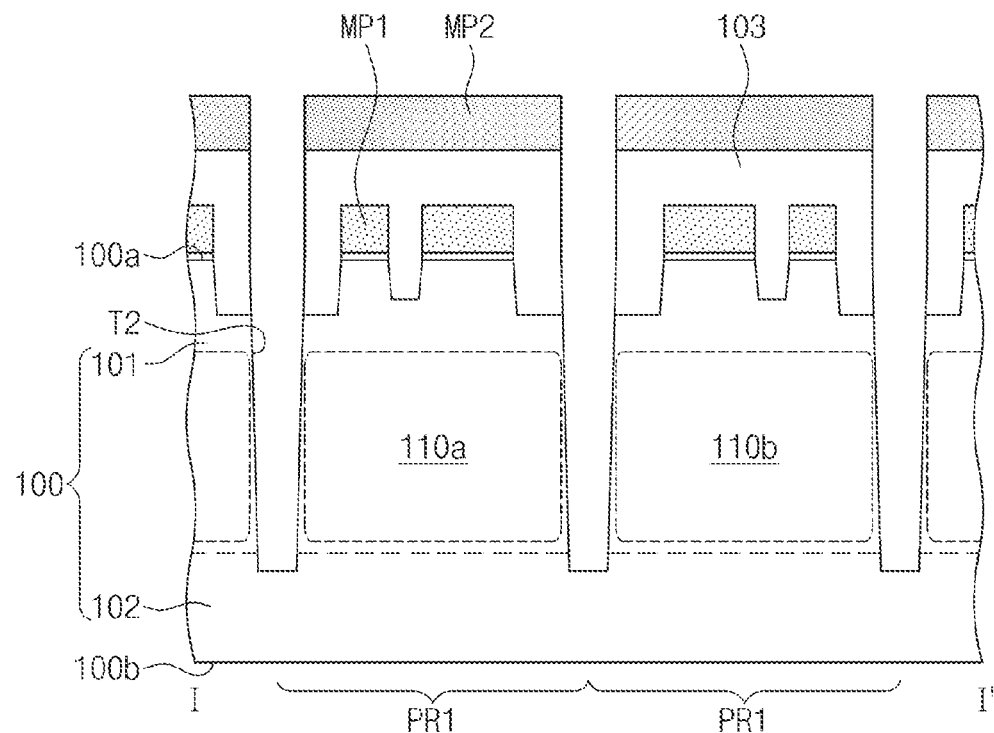

Referring to FIGS. 3 and 13, a second trench T2 may be formed defining the first and second pixel sections PR1 and PR2. The buried dielectric layer 103 and the semiconductor substrate 100 may be patterned to from the second trench T2. The second trench T2 may extend in a vertical direction from the first surface 100a toward the second surface 100b of the semiconductor substrate 100. As the second trench T2 is formed, the first and second pixel sections PR1 and PR2 may be arranged in a matrix along first and second directions D1 and D2 that intersect each other.

The formation of the second trench T2 may include forming a second mask pattern MP2 on the buried dielectric layer 103 and using the second mask pattern MP2 as an etching mask to anisotropically etch the semiconductor substrate 100.

The second trench T2 may expose a sidewall of the epitaxial layer 101 and a portion of the bulk silicon substrate 102. The second trench T2 may be formed deeper than the first trench T1 and may penetrate a portion of the first trench T1.

Referring to FIG. 3, the second trench T2 may include a plurality of first regions that extend in the first direction D1 and have a substantially uniform width, and may also include a plurality of second regions that extend in the second direction D2 intersecting the first direction D1 and have a substantially uniform width.

As an anisotropic etching process is performed to form the second trench T2, the second trench T2 may have a width that gradually decreases in a direction from the first surface 100a to the second surface 100b of the semiconductor substrate 100. For example, the second trench T2 may have an inclined sidewall. The second trench T2 may have a lower surface spaced apart from the second surface 100b of the semiconductor substrate 100.

The formation of the second trench T2 may cause the impurity region 110 to separate into a plurality of impurity regions 110a and 110b. For example, the first and second impurity regions 110a and 110b may be provided in the first pixel sections PR1. Although not shown, the impurity region 110 may be divided into a first impurity region 110a and a second impurity region 110b in the first pixel sections PR1, and may also be divided into a third impurity region 110c and a fourth impurity region 110d in the second pixel sections PR2. The first, second, third, and fourth impurity regions 110a, 110b, 110c, and 110d may respectively correspond to the first, second, third, and fourth photoelectric conversion regions 110a, 110b, 110c, and 110d that are described above. After the formation of the second trench T2, the second mask pattern MP2 may be removed. Although not shown, after the formation of the second trench T2, a barrier layer may be formed which includes impurities of the first conductivity type along an inner wall of the second trench T2.

Figure 14:
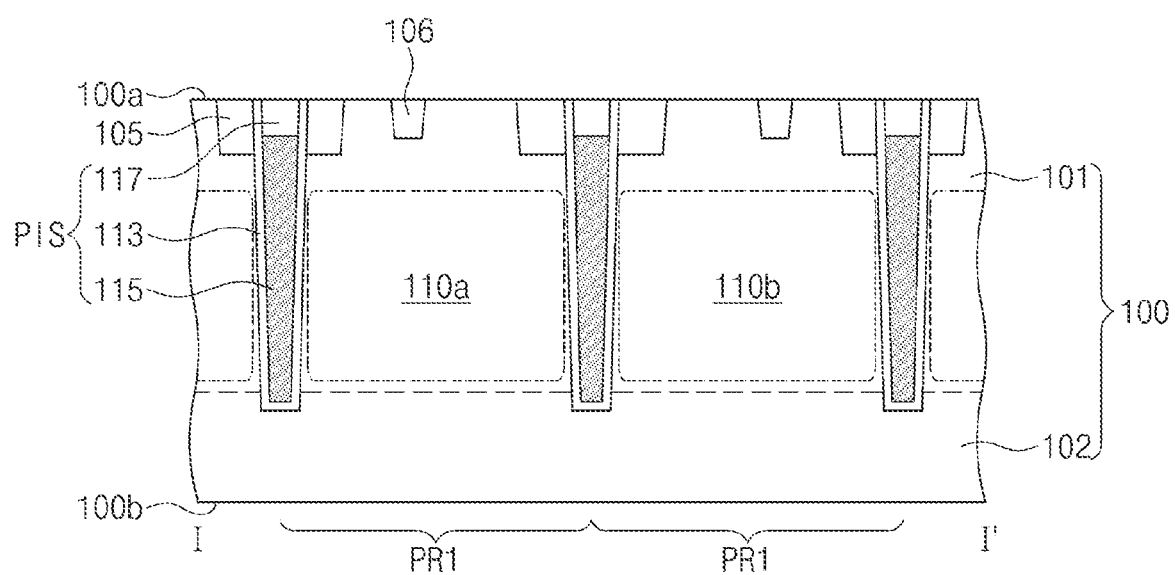

Referring to FIGS. 13 and 14, a pixel isolation structure PIS may be formed in the second trench T2. The pixel isolation structure PIS may include a liner dielectric pattern 113, a semiconductor pattern 115, and a capping dielectric pattern 117.

The formation of the pixel isolation structure PIS may include forming a liner dielectric layer that conformally covers the inner wall of the second trench T2, depositing a semiconductor layer to fill the second trench T2 in which the liner dielectric layer is formed, recessing a upper surface of the semiconductor layer to form the semiconductor pattern 115 in the second trench T2 in which the liner dielectric layer is formed, depositing a capping dielectric layer to fill the second trench T2 in which the semiconductor pattern 115 is formed, planarizing the liner dielectric layer and the capping dielectric layer to form the liner dielectric pattern 113, the semiconductor pattern 115, and the capping dielectric pattern 117 in the second trench T2 until the upper surface of the first mask pattern MP1 is exposed.

After the pixel isolation structure PIS is formed, the first mask pattern MP1 may be removed, and a planarization process may be performed in which the buried dielectric layer 103 is planarized to form first and second device isolation layers 105 and 106 in the first trench (see T1 of FIG. 12) so as to expose the first surface 100a of the semiconductor substrate 100. The planarization process to expose the first surface 100a of the semiconductor substrate 100 may allow the pixel isolation structure PIS to have a upper surface substantially coplanar with those of the first and second device isolation layers 105 and 106.

Figure 15:
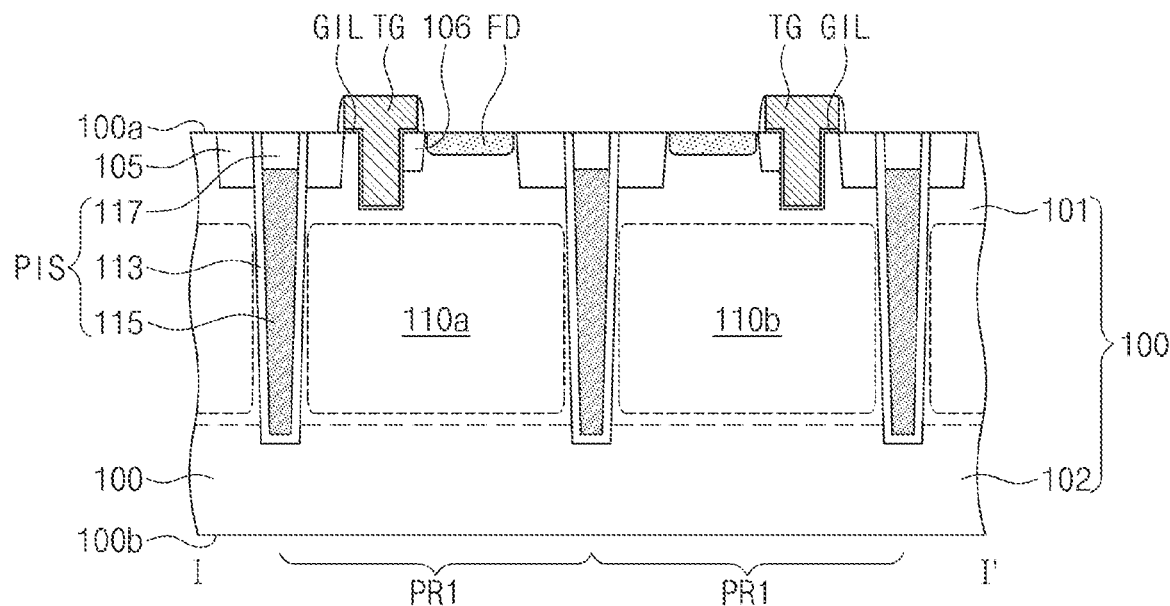

Referring to FIGS. 3 and 15, a transfer gate electrode TG and a floating diffusion region FD may be formed on the semiconductor substrate 100.

For example, the formation of the transfer gate electrode TG may include patterning the semiconductor substrate 100 to form a vertical trench, forming a conductive layer that fills the vertical trench, and patterning the conductive layer. The formation of the transfer gate electrode TG may further include forming a gate dielectric layer GIL that conformally covers the vertical trench and the first surface 100a of the semiconductor substrate before the formation of the conductive layer, and forming a spacer after the patterning the conductive layer.

The formation of the vertical trench may include forming a mask pattern on the first surface 100a of the semiconductor substrate 100, and using the mask pattern as an etching mask to anisotropically etch the semiconductor substrate 100. The vertical trench may have a lower surface disposed at a level than that of a lower surface of the first device isolation layer 105 and that of a lower surface of the second device isolation layer 106. The lower surface of the vertical trench may be disposed at a level higher than those of upper surfaces of the first and second impurity regions 110a and 110b. While the vertical trench is formed, a portion of the second device isolation layer 106 may also be etched. The vertical trench may have a depth that is variously changed based on drive conditions and properties of an image sensor.

When the transfer gate electrode TG is formed, gate electrodes RG, SG, and SFG of readout transistors may also be formed on the second active areas ACT2 of the first and second pixel sections PR1 and PR2.

The formation of the floating diffusion region FD may include forming a mask pattern that covers the first surface 100a of the semiconductor substrate 100 and ion-implanting impurities having the second conductivity type. For example, the floating diffusion region FD may be formed between the second device isolation layer 106 and a portion of the first device isolation layer 105 that is adjacent in the first direction D1 to the second device isolation layer 106.

When the floating diffusion region FD is formed, source/drain impurity regions (not shown) of the readout transistors may also be formed together with floating diffusion region PD.

The foregoing description assumes that the formation of the transfer gate electrode TG is followed by the formation of the floating diffusion region FD. However, in other embodiments of the inventive concept, the formation of the floating diffusion region FD may be followed by the formation of the transfer gate electrode TG.

Figure 16:
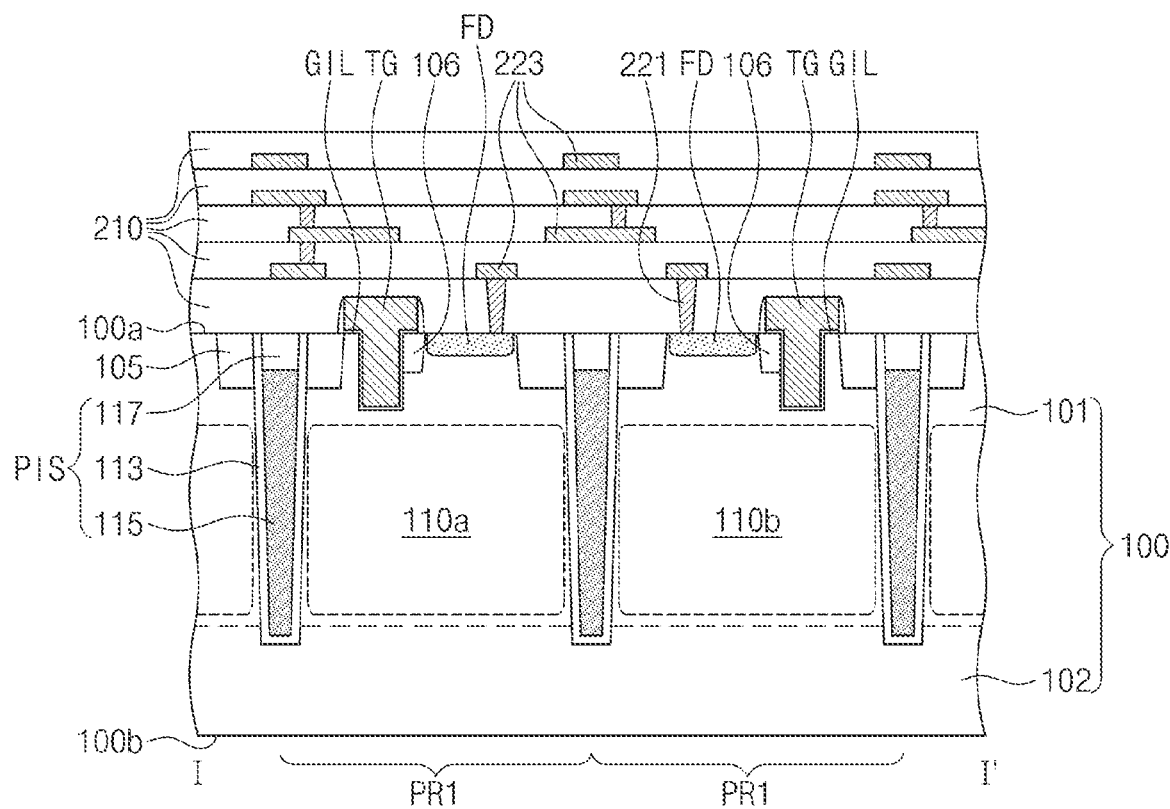

Referring to FIG. 16, interlayer dielectric layers 210 and wire structures 221 and 223 may be formed on the first surface 100a of the semiconductor substrate 100. The interlayer dielectric layers 210 may cover transfer transistors and logic transistors. The interlayer dielectric layers 210 may be formed of a material having superior gap-fill characteristics, and may have their planarized upper portions.

A plurality of contact plugs 221 may be formed to lie in the interlayer dielectric layers 210 and to connect with the floating diffusion region FD or the readout transistors. A plurality of metal lines 223 may be formed in the interlayer dielectric layers 210. The contact plugs 221 and the metal lines 223 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or any alloy thereof.

Figure 17:
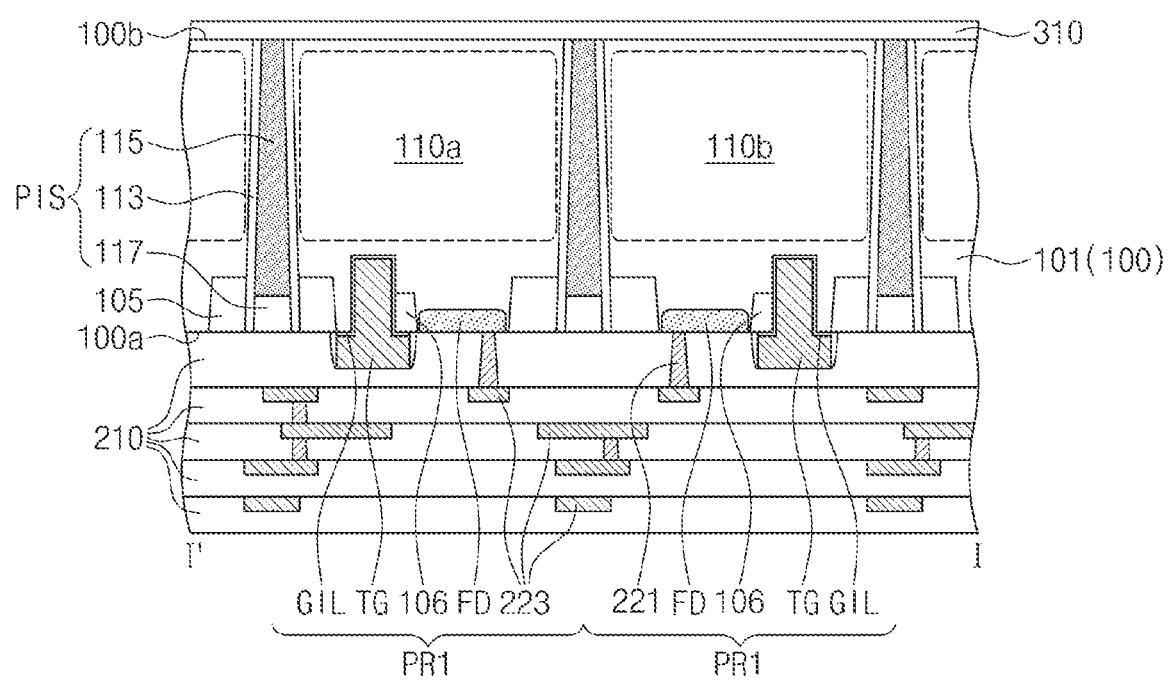

Referring to FIG. 17, a thinning process may be perform to remove a portion of the semiconductor substrate 100, thereby providing the semiconductor substrate 100 with a desirable and substantially reduced thickness. The thinning process may include performing a grinding or polishing process on the second surface 100b of the semiconductor substrate 100, and performing an anisotropic or isotropic etching process on the second surface 100b of the semiconductor substrate 100. The semiconductor substrate 100 may be turned upside-down to perform the thinning process. The grinding or polishing process may be performed to remove the bulk silicon substrate 102 of the semiconductor substrate 100 and to expose the epitaxial layer 101. Thereafter, the anisotropic or isotropic etching process may be performed to remove surfaces defects in an exposed surface of the epitaxial layer 101.

The thinning process performed on the semiconductor substrate 100 may expose the semiconductor pattern 115 of the pixel isolation structure PIS on the second surface 100b of the semiconductor substrate 100. The semiconductor pattern 115 and the liner dielectric pattern 113 may each have a upper surface disposed at substantially the same level as the second surface 100b of the semiconductor substrate 100.

A planarized dielectric layer 310 may be formed on the second surface 100b of the semiconductor substrate 100.

The planarized dielectric layer 310 may cover the upper surface of the semiconductor pattern 115 and the second surface 100b of the semiconductor substrate 100. The planarized dielectric layer 310 may be formed by depositing metal oxide, such as one or more of aluminum oxide and hafnium oxide.

Referring to FIGS. 3 and 4, a grid structure 320 may be formed on the planarized dielectric layer 310. A protection layer 330 may be formed to conformally cover a surface of the planarized dielectric layer 310 and a surface of the grid structure 320 (or may be formed to have a substantially uniform thickness).

Thereafter, a plurality of color filters 340 may be formed on the protection layer 330 to correspond to the first and second pixel sections PR1 and PR2. A plurality of microlenses 350 may be formed on corresponding color filters 340. The microlenses 350 may each have a convex shape with a certain curvature radius. A coating layer 360 may be formed to cover the convex surface of each of the microlenses 350.

Figure 18:
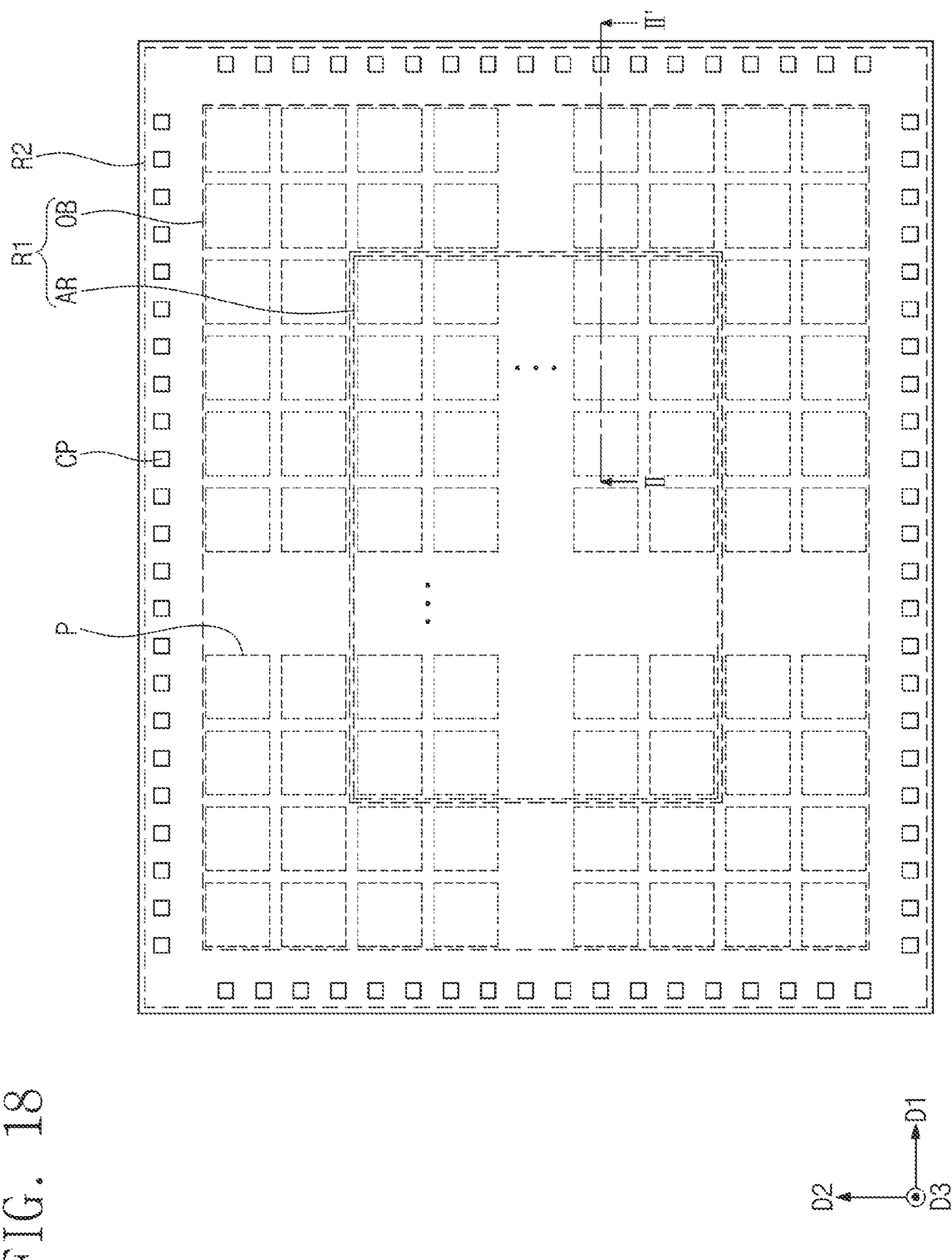
FIG. 18 is a simplified plan view illustrating an image sensor associated with a semiconductor device according to embodiments of the inventive concept.
Figure 19:
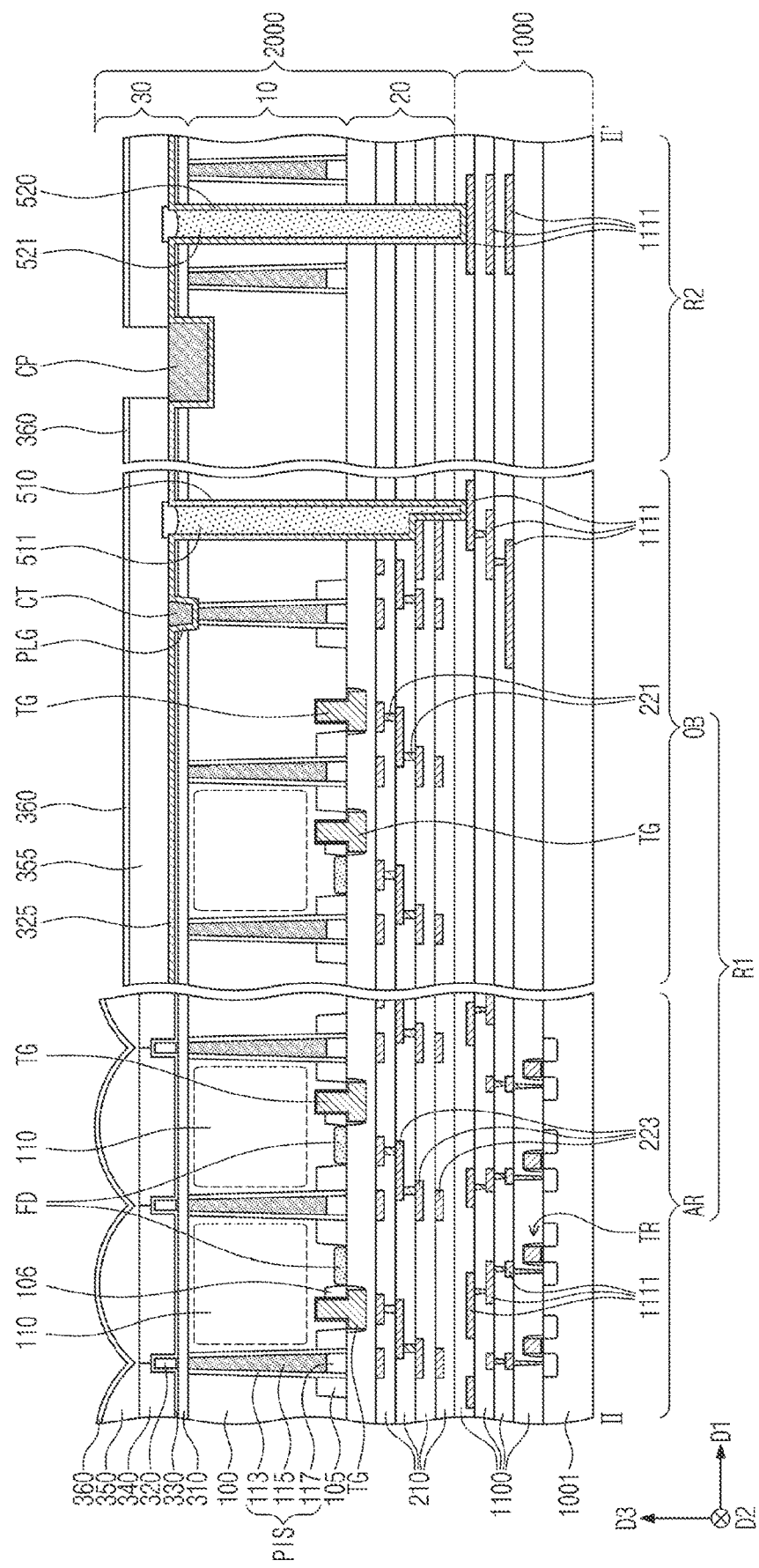
FIG. 19 is a cross-sectional view taken along line II-II' of FIG. 18 and illustrating an image sensor associated with a semiconductor device according to embodiments of the inventive concept.

FIG. 18 is a simplified plan view illustrating an image sensor associated with a semiconductor device according to embodiments of the inventive concept, and FIG. 19 is a cross-sectional view taken along line II-II' of FIG. 18.

Referring to FIGS. 18 and 19, an image sensor may include a logic chip 1000 and a sensor chip 2000 on the logic chip 1000. Referring to FIG. 18, the sensor chip 2000 may include a pixel array section R1 and a pad section R2.

The pixel array section R1 may include a plurality of unit pixels P that are two-dimensionally arranged along a first direction D1 and a second direction D2. Each of the unit pixels P may include a photoelectric conversion element and readout elements. Each unit pixel P of the pixel array section R1 may output electrical signals derived (or converted) from incident light.

The pixel array section R1 may include a light-receiving section AR and a light-shielding section OB. Referring to FIG. 18, the light-shielding section OB may surround the light-receiving section AR. For example, referring to FIG. 18, the light-shielding section OB may be disposed on upside, downside, left-side, and right-side of the light-receiving section AR. The light-shielding section OB may include reference pixels on which no light is incident, and an amount of charge sensed in the unit pixels P of the light-receiving section AR may be compared with a reference amount of charge occurring at the reference pixels, which may result in calculation of magnitude of electrical signals sensed in the unit pixels P.

The pad section R2 may include a plurality of conductive pads CP that are used to input/output control signals and photoelectric conversion signals. For easy connection with external devices, and referring to FIG. 18, the pad section R2 may surround the pixel array section R1. The conductive pads CP may allow an external device to receive electrical signals generated from the unit pixels P.

As described in relation to FIG. 4, the sensor chip 2000 may include a photoelectric conversion layer 10, a readout circuit layer 20, and an optical transmission layer 30. The photoelectric conversion layer 10 of the sensor chip 2000 may include a semiconductor substrate 100, a pixel isolation structure PIS that defines pixel sections, and photoelectric conversion regions 110 provided in the pixel sections. On the light-receiving section AR, the sensor chip 2000 may have technical properties that are substantially similar to those described above in relation to various image sensors according to embodiments of the inventive concept.

On the light-shielding section OB, a portion of the pixel isolation structure PIS may be electrically connected to a contact plug PLG. A contact pad CT may be provided on the contact plug PLG, and the contact pad CT may be provided on the semiconductor substrate 100 on the light-shielding section OB. The contact pad CT may include aluminum. The contact plug PLG may penetrate a portion of the semiconductor substrate 100.

A planarized dielectric layer 310 may extend from the light-receiving section AR toward the light-shielding section OB and the pad section R2. On the light-shielding section OB, a light-shielding pattern 325 may be provided on the planarized dielectric layer 310. The light-shielding pattern 325 may block incidence of light on the photoelectric conversion regions 110 provided on the light-shielding section OB.

On the light-shielding section OB, a first through conductive pattern 510 may penetrate the semiconductor substrate 100 to electrically connect with a metal line 223 of the readout circuit layer 20 and with a wire structure 1111 of the logic chip 1000. The first through conductive pattern 510 may extend onto the semiconductor substrate 100 to electrically connect with the contact pad CT. The first through conductive pattern 510 may have a first lower surface and a second lower surface that are disposed at different levels from each other. A first buried pattern 511 may be provided in the first through conductive pattern 510. The first buried pattern 511 may include a low-refractive material and may have dielectric properties.

On the pad section R2, a plurality of conductive pads CP may be provided on the semiconductor substrate 100. The conductive pads CP may include metal, such as aluminum, copper, tungsten, titanium, tantalum, or any alloy thereof. A plurality of bonding wires may be bonded to the conductive pads CP in a mounting process of the image sensor. The conductive pads CP may be electrically connected through the bonding wires to an external device. The pixel isolation structure PIS may be provided around the conductive pads CP.

On the pad section R2, a second through conductive pattern 520 may penetrate the semiconductor substrate 100 to electrically connect with the wire structure 1111 of the logic chip 1000. The second through conductive pattern 520 may extend onto the semiconductor substrate 100 to electrically connect with the conductive pads CP. A portion of the second through conductive pattern 520 may cover a lower surface and a sidewall of the conductive pad CP. A second buried pattern 521 may be provided in the second through conductive pattern 520. The second buried pattern 521 may include a low-refractive material and may have dielectric properties.

An organic layer 355 may be provided on the light-shielding section OB and the pad section R2. The organic layer 355 may cover the light-shielding pattern 325, the contact pad CT, and the conductive pads CP.

The logic chip 1000 may include a logic semiconductor substrate 1001, logic circuits TR, wire structures 1111 connected to the logic circuits TR, and logic interlayer dielectric layers 1100. An uppermost one of the logic interlayer dielectric layers 1100 may be in contact with the readout circuit layer 20 of the sensor chip 2000. The logic chip 1000 may be electrically connected to the sensor chip 2000 through the first through conductive pattern 510 and the second through conductive pattern 520.

In the foregoing description, it is assumed that the logic chip 1000 and the sensor chip 2000 are electrically connected to each other through the first and second through conductive patterns 510 and 520. However, the scope of the inventive concept is not limited thereto. In other embodiments, bonding pads provided in the logic chip 1000 may be directly coupled to bonding pads provided in the sensor chip 2000 to electrically connect the logic chip 1000 and the sensor chip 2000.

According to various embodiments of the inventive concept, a transfer gate electrode and a floating diffusion region may be provided therebetween with a device isolation layer that effectively inhibits or prevents a gate induced drain leakage (GIDL) phenomenon produced due to an electrical field between the transfer gate electrode and the floating diffusion region, thereby providing images sensors with improved electrical characteristics.

Although the present inventive have been described in connection with the some example embodiments of the inventive concept illustrated in the accompanying drawings, it will be understood by one of ordinary skill in the art that variations in form and detail may be made therein without departing from the spirit and essential feature of the inventive concept. The above disclosed embodiments should thus be considered illustrative and not restrictive.

What is claimed is:

1. An image sensor, comprising:
a substrate including a first surface and a second surface opposing the first surface;
a pixel isolation structure comprising:
a separation pattern directly in contact with the second surface of the substrate, and
a capping pattern between the separation pattern and the first surface of the substrate;
a first photoelectric conversion region in the substrate;
a second photoelectric conversion region in the substrate;
a floating diffusion region connected to the first and second photoelectric conversion regions;
a first transfer gate electrode comprising a first portion on the first surface of the substrate and a second portion extending into the substrate;
a second transfer gate electrode comprising a first portion on the first surface of the substrate and a second portion extending into the substrate; and
a first device isolation layer between the first transfer gate electrode and the floating diffusion region,
wherein the first device isolation layer is vertically overlapping with the first portion of the first transfer gate electrode in a plan view,
wherein the pixel isolation structure is disposed between the first photoelectric conversion region and the second photoelectric conversion region,
wherein the first device isolation layer has a first width in a first direction parallel to the first surface of the substrate in a vertical view and the capping pattern has a second width in the first direction in the vertical view,
wherein the second width is greater than the first width, and
wherein the first transfer gate electrode is vertically overlapping with the first photoelectric conversion region in the plan view and the second transfer gate electrode is vertically overlapping with the second photoelectric conversion region in the plan view.

2. The image sensor of claim 1, wherein the second portion of the first transfer gate electrode has a third height in a second direction perpendicular to the first direction in the vertical view, and
wherein the third height is greater than a height of the first device isolation layer in the second direction.

3. The image sensor of claim 2, wherein the first device isolation layer surrounds at least a portion of a lateral surface of the second portion of the first transfer gate electrode in the plan view.

4. The image sensor of claim 3, wherein the floating diffusion region has a fourth height in the second direction, and
wherein the fourth height is smaller than the height of the first device isolation layer.

5. The image sensor of claim 4, wherein the first device isolation layer is directly in contact with the first portion of the first transfer gate electrode.

6. The image sensor of claim 1, wherein the first device isolation layer entirely surrounds at least a portion of a lateral surface of the second portion of the first transfer gate electrode in the plan view.

7. The image sensor of claim 1, wherein the second portion of the first transfer gate electrode has a third width in the first direction, and
wherein the third width is greater than the first width.

8. The image sensor of claim 1, wherein the first device isolation layer includes a dielectric material.

9. The image sensor of claim 1, wherein the capping pattern is directly in contact with the first surface of the substrate.

10. The image sensor of claim 9, wherein the pixel isolation structure is directly in contact with the second surface of the substrate.

11. The image sensor of claim 1, comprising a single microlens that is disposed on the first and second photoelectric conversion regions.

12. An image sensor, comprising:
a substrate including a first surface and a second surface opposing the first surface;
a pixel isolation structure comprising:
a separation pattern directly in contact with the second surface of the substrate, and
a capping pattern between the separation pattern and the first surface of the substrate;
a first photoelectric conversion region in the substrate;
a second photoelectric conversion region in the substrate;
a floating diffusion region connected to the first and second photoelectric conversion regions;
a first transfer gate electrode comprising a first portion on the first surface of the substrate and a second portion extending into the substrate;
a second transfer gate electrode comprising a first portion on the first surface of the substrate and a second portion extending into the substrate;
a gate dielectric layer on the second portion of the first transfer gate electrode; and
a first device isolation layer between the first transfer gate electrode and the floating diffusion region,
wherein the first device isolation layer is directly in contact with the gate dielectric layer,
wherein the pixel isolation structure is disposed between the first photoelectric conversion region and the second photoelectric conversion region,
wherein the first device isolation layer has a first width in a first direction parallel to the first surface of the substrate in a vertical view and the capping pattern has a second width in the first direction in the vertical view,
wherein the second width is greater than the first width, and
wherein the first transfer gate electrode is vertically overlapping with the first photoelectric conversion region in a plan view and the second transfer gate electrode is vertically overlapping with the second photoelectric conversion region in the plan view.

13. The image sensor of claim 12, wherein the first device isolation layer penetrates the substrate.

14. The image sensor of claim 12, wherein the second portion of the first transfer gate electrode has a third height in a second direction perpendicular to the first direction in the vertical view, and
wherein the third height is greater than a height of the first device isolation layer in the second direction.

15. The image sensor of claim 14, wherein the second portion of the first transfer gate electrode has a third width in the first direction, and
wherein the third width is greater than the first width.

16. The image sensor of claim 14, wherein the floating diffusion region has a fourth height in the second direction, and
wherein the fourth height is smaller than the height of the first device isolation layer in the second direction.

17. The image sensor of claim 15, wherein the first device isolation layer surrounds at least a portion of a lateral surface of the second portion of the first transfer gate electrode.

18. An image sensor, comprising:
a substrate including a first surface and a second surface opposing the first surface;
a pixel isolation structure comprising:
a separation pattern directly in contact with the second surface of the substrate, and
a capping pattern between the separation pattern and the first surface of the substrate;
a first photoelectric conversion region in the substrate;
a second photoelectric conversion region in the substrate;
a floating diffusion region connected to the first and second photoelectric conversion regions;
a first transfer gate electrode comprising a first portion on the first surface of the substrate and a second portion extending into the substrate;
a second transfer gate electrode comprising a first portion on the first surface of the substrate and a second portion extending into the substrate; and
a first device isolation layer between the first transfer gate electrode and the floating diffusion region,
wherein the first device isolation layer is vertically overlapping with the first portion of the first transfer gate electrode in a plan view,
wherein the pixel isolation structure is disposed between the first photoelectric conversion region and the second photoelectric conversion region,
wherein the first device isolation layer has a first width in a first direction parallel to the first surface of the substrate in a vertical view and the capping pattern has a second width in the first direction in the vertical view,
wherein the second width is greater than the first width,
wherein the first transfer gate electrode is vertically overlapping with the first photoelectric conversion region in the plan view and the second transfer gate electrode is vertically overlapping with the second photoelectric conversion region in the plan view,
wherein the second portion of the first transfer gate electrode has a first height in a second direction perpendicular to the first direction in the vertical view,
wherein the first device isolation layer has a second height in the second direction, and
wherein the first height is greater than the second height.

19. The image sensor of claim 18, wherein the first portion of the first transfer gate electrode covers at least a portion of an upper surface of the first device isolation layer.

20. The image sensor of claim 18, wherein a lower surface of the second portion of the first transfer gate electrode is at a level lower than a level of a lower surface of the first device isolation layer.

* * * * *